US008901927B2

(12) United States Patent
Gross

(10) Patent No.: US 8,901,927 B2
(45) Date of Patent: Dec. 2, 2014

(54) SUPPLEMENTATION OF ACQUIRED, UNDERSAMPLED MR DATA

(75) Inventor: Patrick Gross, Langensendelbach (DE)

(73) Assignee: Siemens Aktiengesellschaft, Munich (DE)

( * ) Notice: Subject to any disclaimer, the term of this patent is extended or adjusted under 35 U.S.C. 154(b) by 445 days.

(21) Appl. No.: 13/302,191

(22) Filed: Nov. 22, 2011

(65) Prior Publication Data

US 2012/0133361 A1 May 31, 2012

(30) Foreign Application Priority Data

Nov. 25, 2010 (DE) .......................... 10 2010 061 977

(51) Int. Cl.
*G01V 3/00* (2006.01)
*G01R 33/561* (2006.01)
(52) U.S. Cl.
CPC .................................. *G01R 33/5611* (2013.01)
USPC ....................................................... 324/309
(58) Field of Classification Search
CPC ...... G01R 33/54; G01R 33/56; G01R 33/485; G01R 33/561; G01R 33/4824; G01R 33/4828; G01R 33/5611; G01R 33/5616; G01R 33/5617
USPC ................................................. 324/300–322
See application file for complete search history.

(56) References Cited

U.S. PATENT DOCUMENTS

| | | | |
|---|---|---|---|
| 5,243,284 A * | 9/1993 | Noll ............................... | 324/309 |
| 6,341,179 B1 * | 1/2002 | Stoyle et al. .................. | 382/254 |
| 7,084,626 B2 * | 8/2006 | Ma et al. ....................... | 324/307 |
| 7,358,729 B2 * | 4/2008 | Ma et al. ....................... | 324/307 |
| 7,382,127 B2 * | 6/2008 | Gaddipati et al. ............ | 324/309 |
| 7,583,082 B1 | 9/2009 | Hu et al. | |
| 7,619,410 B2 | 11/2009 | Beatty et al. | |
| 7,741,842 B2 * | 6/2010 | McKenzie et al. ............ | 324/307 |
| 8,638,096 B2 * | 1/2014 | Zhang et al. .................. | 324/309 |
| 8,675,942 B2 * | 3/2014 | Chang et al. .................. | 382/131 |
| 2005/0187458 A1 | 8/2005 | Kannengiesser et al. | |
| 2006/0284812 A1 | 12/2006 | Griswold et al. | |
| 2007/0010731 A1 | 1/2007 | Mistretta | |
| 2007/0164740 A1 | 7/2007 | Yun et al. | |
| 2009/0080798 A1 | 3/2009 | Maurer et al. | |
| 2010/0237864 A1 | 9/2010 | Stemmer | |

OTHER PUBLICATIONS

"Fast MR Image Reconstruction for Partially Parallel Imaging With Arbitrary k-Space Trajectories," Ye et al., IEEE Trans. On Medical Imaging, vol. 30, No. 3 (2011) pp. 575-585.

(Continued)

*Primary Examiner* — Dixomara Vargas
(74) *Attorney, Agent, or Firm* — Steven H. Noll

(57) ABSTRACT

In a computerized method and magnetic resonance (MR) system for the supplementation of acquired MR data, at least one supplemented MR data set is determined from multiple acquired, reduced MR data sets that can be acquired with an accelerated acquisition method (such as partially parallel acquisition method, ppa) in which k-space is undersampled. The acquisition can thereby take place in parallel with multiple acquisition coils. In the method and system, a reconstruction kernel is applied to the multiple acquired, reduced MR data sets in order to determine a reconstructed MR data set for an acquisition coil. The reduced MR data set acquired with the acquisition coil is reused in this reconstructed MR data set. The reuse takes place by a combination with weighting with the respective variances.

37 Claims, 7 Drawing Sheets

(56) References Cited

OTHER PUBLICATIONS

"A General Information for Quantitative g-factor Calculation in GRAPPA Reconstructions," Breuer et al., Proc. Intl. Soc. Mag. Reson. Med., vol. 16 (2008), p. 10.

Auto-Calibrated Parallel Imaging Reconstruction for Arbitrary Trajectories Using k-space Sparse Matrices (kSPA, Liu et al., IEEE Trans, on Medical Imaging, vol. 29, No. 3, (2010) pp. 950-959.

"SPIRiT: Iterative Self-consistent Parallel Imaging Reconstruction from Arbitrary k-Space," Lustig et al., Magnetic Resonance in Medicine, vol. 64 (2010) pp. 457-471.

* cited by examiner

US 8,901,927 B2

SUPPLEMENTATION OF ACQUIRED, UNDERSAMPLED MR DATA

BACKGROUND OF THE INVENTION

1. Field of the Invention

The present invention concerns a method to supplement MR data that were acquired with an accelerated acquisition method that undersamples k-space, as well as such a magnetic resonance system. Furthermore, the invention concerns an electronically readable data medium for implementing such a method.

2. Description of the Prior Art

Magnetic resonance tomography (MRT) is an imaging modality that enables the acquisition of two-dimensional or three-dimensional image data sets that can depict structures inside an examined person, in particular soft tissue as well, with high resolution. In MRT, protons in an examination subject are aligned in a basic magnetic field (B0) such that a macroscopic magnetization arises that is subsequently excited via the radiation of RF (radio-frequency) pulses. The decay of the excited magnetization is subsequently detected by one or more induction coils, wherein a spatial coding of the acquired MR signal can be achieved via the application of different magnetic field gradients (for slice selection, phase coding or frequency coding). The acquired MR signals initially exist in a positional (spatial) frequency space (also called k-space) and can be transformed into the image space by subsequent Fourier transformation. By the targeted switching (activation) of the magnetic field gradients, k-space can be scanned (i.e. data entered therein at respective data entry locations or points in k-space) with different trajectories, wherein a conventional scanning involves the successive acquisition of frequency-coded k-space lines (generally oriented along the X-axis of k-space) for different phase codings (that define the Y-axis of k-space).

In order to reduce the acquisition duration, for example given the acquisition of MR image data of a freely breathing examined person, various methods have been proposed that undersample k-space, meaning that they omit k-space lines or k-space points to be scanned, for example. Examples of such techniques are Generalized Auto-Calibrating Partially Parallel Acquisition (GRAPPA), Sensitivity Encoding (SENSE) and Simultaneous Acquisition of Spatial Harmonics (SMASH) imaging methods that are also generally designated as partially parallel acquisition (PPA) methods. For example, GRAPPA has the advantage that it is a self-calibrated method and only requires the inversion of a relatively small matrix to determine the parameters of the GRAPPA reconstruction kernel. However, the GRAPPA reconstruction kernel must be adapted to a defined scanning pattern (with which k-space is undersampled). Methods that apply arbitrary k-space trajectories to scan said k-space (and that by now are used in many imaging methods) can thus not be combined with the GRAPPA method without additional measures. Methods such as the monitoring of gradients or magnetic fields in order to determine actual k-space trajectories, k-space trajectories such as rosettes and spirals, and even random k-space trajectories increasingly arouse interest for use in imaging methods, but such acquisition methods cause irregular gaps or omissions in the acquired k-space data.

This can lead to the situation that multiple reconstruction seats must be provided in order to close a gap in k-space, but it is not always clear which reconstruction kernel should be selected to supplement the k-space data. The gaps or omissions in k-space can also be larger than the reconstruction kernels that are used, which can lead to the situation that such reconstruction kernel cannot completely close these gaps.

There are methods that, for example, have used a GRAPPA kernel to close gaps in k-space that are larger than the reconstruction kernel. A reconstruction kernel was thereby used that can extrapolate the k-space data in one direction, and this was repeatedly applied to the reconstructed data in order to close a larger k-space In this direction. A reconstruction kernel must in turn be selected that corresponds to the direction to be extrapolated, such that the k-space trajectories must be known. Furthermore, the reconstruction errors compound. Such a method also offers no solution for closing irregular gaps.

Furthermore, the MR data reconstructed with the reconstruction kernel can have relatively significant errors or noise. To reduce this, the data points of the reconstructed MR data for which MR data was actually measured are replaced with these measured data. However, such a procedure can lead to a degradation of the ultimately determined MR data, for example in cases in which the actual acquired MR data are severely plagued with noise.

Given an accelerated acquisition method, it is thus desirable to reconstruct supplemented MR data with optimally high precision, i.e. with optimally low noise. Furthermore, it is desirable to enable an optimally precise automatic reconstruction of MR data, even if the underlying produced MR data were acquired with an arbitrary k-space trajectory and/or if the reduced MR data have arbitrary—even larger or irregular—omissions or, respectively, gaps.

SUMMARY OF THE INVENTION

An object of the present invention is to avoid at least some of the aforementioned disadvantages and to provide an optimally precise and reliable supplementation of MR data that were acquired with an accelerated acquisition method.

According to a first aspect of the present invention, a method to supplement acquired MR data is provided in which at least one supplemented MR data set is determined from multiple acquired, reduced MR data sets. The multiple reduced MR data sets were acquired in parallel with an acquisition coil with an accelerated acquisition method that undersamples k-space. The supplemented MR data set is determined for at least one of the acquisition coils, but it can also be determined for each of the acquisition coils. A reconstruction kernel provided for the acquisition coil is thereby applied to the multiple reduced MR data sets. The reconstruction kernel calculates from the multiple reduced MR data sets a reconstructed MR data set (including supplemented MR data) for this acquisition coil. This takes place by the reconstruction kernel reconstructing from the MR data, which are comprised in the multiple acquired, reduced MR data sets, at least some of the MR data that are absent in the reduced MR data set acquired with this acquisition coil. Furthermore, variances of the reduced MR data set acquired with the acquisition coil are determined as MR data variances, and variances of the MR data set reconstructed for the acquisition coil are determined as reconstruction data variances. Furthermore, a reuse of the reduced MR data set acquired with the acquisition coil takes place in the reconstructed MR data set to determine the supplemented MR data set for this acquisition coil. The reuse takes place by combining the reduced MR data set weighted with the MR data variances and the reconstructed MR data set weighted with the reconstruction data variances.

For example, the reuse can take place by adding the reduced MR data set and the reconstructed MR data set weighted with the respective variances. The weighting with the variances advantageously takes place such that greater variances lead to a smaller weighting of the corresponding MR data. It can thus be ensured that the data that have a smaller variance, and therefore a greater confidence, are given greater consideration in the ultimately determined supplemented MR data set. For example, this is advantageous in the case in which the acquired, reduced image data set exhibits artifacts or increase noise for specific data points, such that the data point reconstructed with the reconstruction kernel from the multiple data sets acquired with different acquisition coils represents a more precise value plagued with less noise.

In one embodiment, the determination of the variances of the reconstructed MR data set can include a determination of the variances of the elements of the reconstruction kernel. In particular, the variances of the reconstructed MR data set can be determined from the variances of the elements of the reconstruction kernel and the variances of the multiple reduced MR data sets. The reconstruction kernel (which, for example, is determined from the acquired MR data sets given an auto-calibrated method) can likewise be plagued with error, such that the consideration of its variances enables a more precise determination of the supplemented MR data set.

In the determination of the MR data variances for the reduced MR data set acquired with the specific acquisition coil, the variances in k-space for k-space points that have not been scanned can be set to a predetermined—in particular high—value. The predetermined value can, for example, be the maximum value of a central k-space point, or can be determined according to a model that, for example, decreases from the middle of k-space to the edge of k-space. By setting the variances for un-scanned k-space data points to a predetermined—in particular high —value, it can be ensured that these data points of the reduced MR data set are only slightly weighted in the combination and thus do not negatively affect the MR data are reconstructed for these data points. It should be clear that the method can be implemented both in k-space and in image space, wherein the variances that are used in such a manner can be transformed via a corresponding transformation into the image space for implementation of the method.

The determination of the MR data variances and the reconstruction data variances can comprise the determination of a covariance matrix for the reduced MR data set or for the reconstructed MR data set. Not only the variances of the data per se but also correlations between the MR data of the multiple reduced MR data sets can be registered with such a covariance matrix. The weighting with the MR data variances and the reconstruction data variances can, for example, then take place by multiplication of the reduced MR data set, multiplication of the reconstructed MR data set with the inverses of the respective covariance matrix. The covariance matrices are advantageously used in an implementation of the method in k-space. For simplification, it is also possible to set the non-diagonal elements (except for the principal diagonals) of the covariance matrices to 0. In particular, it can thereby be avoided that excessively large covariance matrices must be worked with in image space.

The MR data variances and the reconstruction data variances can be respectively determined, for example, as a diagonal covariance matrix or as a variance vector that respectively include only the corresponding variances. The inverses of a diagonal covariance matrix can also be determined in a simple manner.

The MR data sets can exist in k-space or in image space. The calculation of the reconstructed MR data set can then take place by aliasing of the corresponding reconstruction kernel with the multiple reduced k-space data sets or by field multiplication of the corresponding reconstruction kernel with the multiple reduced MR image data sets, for example. The reconstruction kernel in k-space and the reconstruction kernel in image space can be transformed into one another via a corresponding transformation, for example via a Fourier transformation. As was mentioned above, the corresponding variances can similarly be respectively transformed into k-space or image space. The matrix representing the reconstruction kernel can be diagonal. Instead of a matrix multiplication in image space, it is then possible to store the MR image data and the elements of the reconstruction matrix as images and to implement a multiplication per element.

In one embodiment, the determination of the variances for the reconstruction kernel can comprise all steps. A conditional probability for the discovery of the noise-plagued MR data set acquired for the acquisition coil is determined with the assumption that there are an underlying determined MR signal and a determined covariance matrix for this, wherein the conditional probability depends on, among other things, the error-plagued reconstruction kernel elements. A complex prior is added to this conditional probability, wherein the prior makes an assumption about the distribution of the elements of the reconstruction kernel that is dependent on the covariances of the reconstruction kernel elements and the underlying reconstruction kernel elements. The conditional probability is subsequently marginalized over the error-plagued reconstruction kernel elements, whereby the covariances of the reconstruction kernel elements can be determined. The variances of the reconstruction kernel elements can thus be determined in a precise manner.

In one embodiment, the method it is repeatedly implemented iteratively. In iteration steps following a first iteration step, the respective supplemented MR data set determined with the preceding iteration step is then used in a subsequent iteration step as a reduced MR data set for the determination of the reconstructed MR data set by means of the reconstruction C. Each iteration step can initially be executed for each acquisition coil so that a supplement to the MR data set is provided for each acquisition coil as a result of the iteration step. In the next iteration step, the reconstruction kernel for a specific acquisition coil can then be applied to all supplemented MR data sets that have previously been determined for this in order to determine the reconstructed MR data set for this acquisition coil for the iteration step.

After an iteration step, the supplemented MR data set for an acquisition coil can still have gaps or omissions, particularly if a small reconstruction kernel is used. These gaps can be closed by repeated iteration. In particular, an iteration takes place until the supplemented MR data set obtained according to an iteration step represents a complete MR data set for an acquisition coil. For example, the data set is complete when MR data have been reconstructed for all predetermined k-space points to be scanned.

The reduced MR data set originally acquired for the corresponding acquisition coil can thereby be reused in each iteration step. The MR data set generated with the reconstruction kernel includes reconstructed MR data, such that reconstruction errors compound given a repeated iteration so that a sufficient precision of the resulting MR data set cannot be ensured after multiple iteration steps. By reusing the acquired reduced MR data set with the weighting with the variances that is described above, it can be ensured that no compounding of the reconstruction errors takes place even after multiple iterations.

It is likewise possible to reuse the supplemented MR data set (determined with the respective preceding iteration step)

in the reconstructed MR data set in each iteration step, i.e. to combine these two data sets with weighting with the respective variances. It can thereby be ensured that the reconstructed MR data that have the smallest variances are respectively used for k-space lines reconstructed in earlier iteration steps, which k-space lines are not comprised in the acquired MR data sets, for example. It is thus possible to determine a supplemented MR data set that has optimally small variances (and therefore an improved precision), even given higher reduction factors (that lead to greater omissions) and smaller reconstruction kernels.

Furthermore, it is possible to add a mask in the combination of the reduced MR data sets and the reconstructed MR data set. The mask can comprise a mask MR data set and mask variances, wherein the mask MR data set is weighted with the mask variances and is combined with the reduced MR data set and the reconstructed MR data set. The mask defines regions that are to be shown in the supplemented MR data set. Regions that are not of interest can thus be effectively suppressed.

For example, in image space the mask MR data set can correspond to an MR image whose pixel values are set to 0, wherein the mask variances in image space are set to high predetermined values in the regions to be shown and are set to comparatively lower predetermined values outside of these regions. In the case of a combination in which the data sets are weighted with the variances, the "0 values" of the mask data set thus experience a very high weighting in the regions that are not to be shown, such that the data of the other data sets are effectively suppressed there. In the other regions they experience a very low weighting, such that there the MR data of the other data sets are decisive. It should thereby be clear that the addition of the empty mask MR data set does not actually need to be implemented given the actual addition of the image data weighted with the variances; rather, it is sufficient to take the mask variances into account in the normalization.

According to a further embodiment, a method is provided to supplement acquired MR data in which at least one supplemented MR data set is determined from multiple acquired reduced MR data sets. The multiple reduced data sets were thereby respectively acquired in parallel with an acquisition coil with an accelerated acquisition method that undersamples k-space. The method includes an application of at least one first reconstruction kernel and one second reconstruction kernel (that is different than the first reconstruction kernel)—which first and second reconstruction kernel are respectively provided for the same acquisition coil—to the multiple reduced MR data sets, wherein the first or, respectively, second reconstruction kernel calculates from the multiple reduced MR data sets a reconstructed MR data set comprising first or, respectively, second MR data for this acquisition coil.

The variances of the at least one first and second reconstructed MR data set are determined as first and second reconstruction data variances, respectively. As illustrated above, this can take place under consideration of the variances of the corresponding reconstruction kernel and the variances of the multiple reduced MR data sets. The at least one first reconstructed MR data set and second reconstructed MR data set are subsequently combined to form a combined reconstructed MR data set, wherein the combination takes place with weighting of the at least one first reconstructed MR data set and second reconstructed MR data set with the reconstruction data variances determined for the respective reconstructed MR data set.

The weighting can in turn take place such that higher variances lead to a lower weighting of the corresponding MR data.

Given a defined scanning sequence to acquire the reduced MR data sets, different reconstruction kernels can have different suitabilities for the reconstruction of the MR data. The MR data sets reconstructed with different reconstruction kernels can therefore have different variances that provide an indication of the quality of the respective reconstruction. Through the combination of the MR data sets reconstructed with different kernels given weighting with the respective variances, an automatic selection of the best suitable reconstruction kernel can thus take place since the MR data reconstructed with the reconstruction kernel will have the lowest variances and are thus most strongly weighted in the supplemented MR data. Since a combination of the multiple reconstructed MR data sets takes place given weighting with the variances, it is furthermore possible that the data reconstructed with a kernel are weighted more significantly at some positions and the data reconstructed with a different kernel are weighted more significantly at other positions, such that the reconstruction delivering the best results is automatically selected even for different omissions in the same MR data set. The scanning method on which the reduced MR data sets are based therefore does not need to be known; rather, it is possible to supplement MR data acquired with arbitrary accelerated acquisition methods. A precise matching of the reconstruction kernel to the acquisition method that is used does not need to take place.

In another embodiment the method furthermore includes a reuse of the reduced MR data set acquired with the acquisition coil in the combined reconstructed MR data set to determine a supplemented MR data set. This can take place as described above, but in this embodiment there is no reuse in the respective reconstructed MR data set but rather in the combined reconstructed MR data set that has been determined beforehand. Naturally, this can take place as described above given weighting with the respective variances. The combination of the MR data sets reconstructed with different reconstruction kernels and the reuse of the acquired reduced MR data set can take place in one step, wherein the reduced MR data set is weighted with the MR data variances and the reconstructed MR data sets are weighted with the respective reconstruction data variances that have been determined for them.

The combination can take place essentially in one step in that the reduced MR data sets weighted with the variances are added, for example. However, it is also conceivable that the combination of the MR data sets reconstructed with different reconstruction kernels takes place iteratively in that the reconstructed MR data set determined with one of the reconstruction kernels in one iteration step is combined with the supplemented MR data set determined in the preceding iteration step, given weighting with the respective variances, to determine the supplemented MR data set for this iteration step. The reuse can take place in each iteration step. The reconstructed MR data sets determined with different reconstruction kernels are thus successively combined with the respective preceding result. Since only two data sets are thus respectively combined, the combination is simplified; in particular, less storage is required.

The combination of the MR data sets reconstructed with different reconstruction kernels—both in one step as well as iteratively—is naturally also possible within the scope of the iteration method described in the preceding, in which the kernels are repeatedly applied to close larger gaps in the reduced MR data sets. In each iteration step to close a larger gap, the MR data reconstructed with the best suitable reconstruction kernel can thus preferably be taken into account.

In one embodiment, the MR data set reconstructed with one of the reconstruction kernels is compared with the acquired reduced MR data set, with the MR data set reconstructed with a different reconstruction kernel, or with the combined reconstructed MR data set, in order to establish whether the reconstruction kernel has a sufficient reconstruction precision or in order to identify artifacts in the acquired MR data set. Given a reconstruction kernel that operates well, for example, the MR data reconstructed for a k-space line should significantly correspond to the MR data actually acquired for the same k-space line, wherein deviations indicate either a lack of suitability of the reconstruction kernel or an interference or artifact formation in the acquisition of the MR data. A differentiation of these cases can be achieved via a further comparison with MR data reconstructed with other reconstruction kernels, for example. In particular, the comparison can take place in that a distance in units of standard deviations is determined between the data points of the reconstructed MR data set and data points of the MR data set compared with this. If the distance is large, a data point with an artifact or a data point for which the employed reconstruction method is unsuitable is present.

It should be clear that the described method of the combination of MR data sets reconstructed with multiple reconstruction kernels can furthermore comprise the method steps described in the preceding, in particular the features described in the preceding with regard to the reuse of the reduced MR data set, the determination of the variances, the iterative implementation of the method by repeated application of the reconstruction kernels and the addition of a mask given the combination.

The method that is additionally described above, in which the reduced MR data set is reused, can similarly take place as described above with application of multiple reconstruction kernels.

In one embodiment the combination can comprise a weighting of the reconstructed MR data set or of the combined reconstructed MR data set with a predetermined weighting factor.

The weighting factor can be determined for each of the MR data sets reconstructed with different reconstruction kernels, such that reconstruction MR data sets determined with extrapolated kernels are weighted less than reconstructed MR data sets determined with interpolated kernels. Interpolated kernels can normally reconstruct MR data with higher precision since these use data on multiple sides of a gap to close the gap. In contrast to this, the data reconstructed with extrapolating kernels are normally plagued with a high uncertainty so that their lower weighting overall leads to an improved reconstruction result.

The predetermined weighting factor can also be set such that, given the combination to determine the supplemented MR data sets, the contribution of the reconstructed or combined reconstructed MR data set is reduced relative to the contribution of the reduced MR data set acquired for the acquisition coil. In particular, given the simultaneous use of a number of reconstruction kernels it can occur, due to the aforementioned weighting with the variances given simultaneous combination and reuse, that these are weighted more significantly than the actual acquired, reduced MR data set. This can be compensated by the predetermined weighting factor in that the weighting is increased for the actual acquired MR data set.

For example, the reconstruction kernel can be a GRAPPA kernel or a SENSE kernel. As described above, a transformation of these kernels between k-space (or reciprocal space) and image space (or positional space) is possible.

The method described in the preceding is advantageously implemented for each of the multiple reduced MR data sets that were respectively acquired with a different acquisition coil. A reconstructed MR data set is thereby determined for each acquisition coil by application of a reconstruction kernel provided for this acquisition coil to the multiple reduced MR data sets. A supplemented MR data set can then be determined for each acquisition coil. In the case of an iterative application of the method, these multiple supplemented MR data sets can then represent the basis of the next iteration step.

The elements of the reconstruction kernel can be determined from data of a central k-space region of the multiple reduced MR data sets that was completely scanned. An autocalibration is thus conceivable in which the elements of the respective reconstruction kernel are determined directly from the acquired MR data. In other embodiments, it is naturally likewise possible to implement a calibration measurement (for example) in order to determine elements of the reconstruction kernel, for example by measuring a sensitivity profile of the acquisition coils.

The method can furthermore include the determination of a geometry (g) factor for the supplemented MR data set. The determination of the g-factor can be the determination of a covariance matrix for the supplemented MR data set as well as the calculation of the determinants of this covariance matrix. The g-factor can thus in particular be determined by the elements of the principal diagonals of the covariance matrix for the supplemented MR data set. The method can furthermore include a minimization of the g-factor. For example, this can be achieved in that the reconstruction kernel used for reconstruction and the trajectory for scanning k-space (i.e. to acquire the reduced MR data set) can be matched to one another. For example, a reconstruction kernel can be selected that has smaller elements where the scan trajectory has high variances, i.e. greater uncertainty. Alternatively, higher variances of the MR data can be accepted at points at which the reconstruction kernel elements are small, which enables the selection of a corresponding trajectory for scanning k-space.

Furthermore, the minimization can take place such that the g-factor or, respectively, the variances for the supplemented MR data set is or are minimized in predetermined image regions, for example for a predetermined region ("Region of Interest", ROI—a defined organ, for example. The trajectory and/or the reconstruction kernel can be selected accordingly. Areas outside of this region can have both high variances in the reduced MR data and reconstruction kernel elements with high values.

Furthermore, the method can comprise a pre-processing of the acquired reduced MR data sets, wherein the pre-processing takes place such that the noise of the MR data is uncorrelated and the covariance matrix for the reduced MR data sets corresponds to the unit matrix.

The method steps described in the preceding can be executed automatically by a computer.

The above object also is achieved in accordance with the present invention by a magnetic resonance system that is designed to implement a supplementation of acquired MR data in which at least one supplemented MR data set is determined from multiple reduced MR data sets acquired in parallel. This magnetic resonance system includes an acquisition unit that has multiple acquisition coils for parallel acquisition of MR data, a control unit that is designed (configured) to implement a parallel acquisition method that undersamples k-space, in which the control unit activates the acquisition unit for parallel acquisition of a reduced MR data set with each of the multiple acquisition coils, and a computer that is designed to implement any or all of the method embodiments described above. Advantages similar to those cited above can be achieved with such a magnetic resonance system.

The invention also encompasses a non-transitory, computer-readable data storage medium encoded with programming instructions that, when the storage medium is loaded into a computerized control system of a magnetic resonance system, cause the computerized control system to implement any or all of the embodiments of the method described above.

Naturally, the embodiments and aspects of the present invention that are described in the preceding can be combined with one another. In particular, the features can be used not only in the described combinations but also in other combinations or independently, without leaving the scope of the invention.

DESCRIPTION OF THE PREFERRED EMBODIMENTS

In the embodiments of the invention that are described in the following, reduced MR data sets acquired with a ppa method are reconstructed by means of one or more reconstruction kernels (also just called kernels) and combined with the originally acquired MR data sets. This can take place both in k-space and in image space. If the following descriptions relate to one of the spaces, it should be clear that the method can be implemented accordingly in the other space. Different partially parallel acquisition methods—such as GRAPPA, SENSE or SMASH—use different reconstruction kernels to reconstruct missing MR data. Although the following description may relate to a specific one of these reconstruction kernels, it should be clear that the method can also be implemented accordingly with a different reconstruction kernel. The corresponding reconstruction kernels can exist in k-space or in image space and can be transformed between these domains, for example using a matrix formulation for Fourier transformation (fft, for example).

Figure 1:
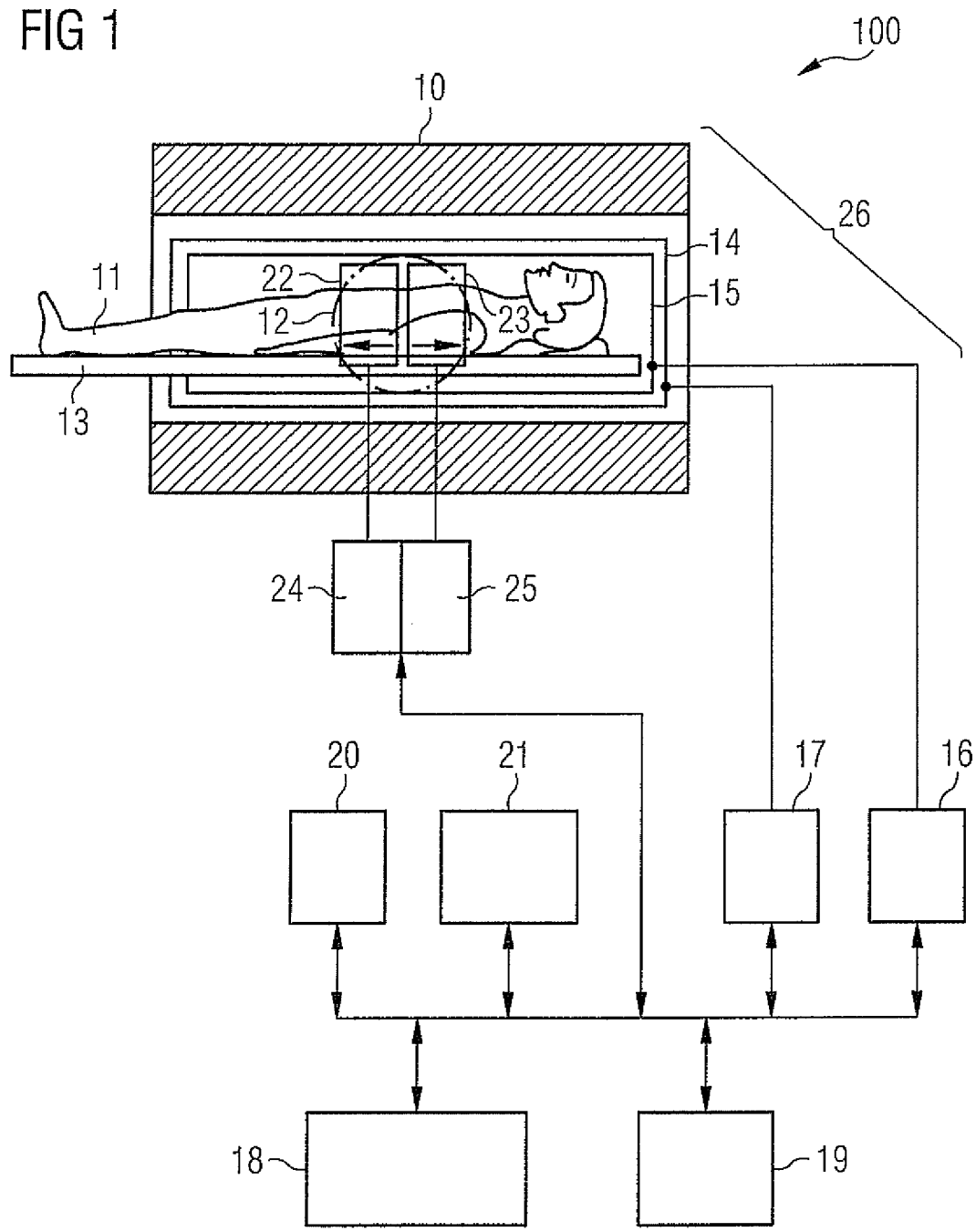
FIG. 1 schematically illustrates an embodiment of the magnetic resonance system according to the invention.

FIG. 1 schematically shows a magnetic resonance system 100 according to an embodiment of the present invention. The MR system has a magnet 10 to generate a polarization field $B_0$. An examination subject—here an examined person 11—on a bed table 13 can be moved into the magnet 10, as is schematically represented by the arrow. The MR system furthermore has a gradient system 14 to generate magnetic field gradients that are used for the imaging and spatial coding. To excite the polarized nuclear spins that result in the basic magnetic field, a radio-frequency coil arrangement 15 is provided that radiates a radio-frequency field into the examined person 11 in order to deflect the magnetization out of the steady state. A gradient unit 17 is provided to control the magnetic field gradient and an RF unit 16 is provided to control the radiated RF pulses.

The acquisition of magnetic resonance signals from the examination region 12 can take place by means of the radio-frequency coil arrangement 15. In particular given the implementation of an accelerated acquisition method (for example GRAPPA, SENSE or SMASH), the magnetic resonance system can also have local acquisition coils or component coils, wherein FIG. 1 shows an example of two local acquisition coils 22 and 23. These can be part of a larger coil array (phased array coils, for example) that has additional acquisition coils. Additional spatial information is obtained due to the spatially independent arrangement of the coils, and thus the different sensitivity profiles. Essentially, an additional spatial coding can be achieved via a suitable combination of the magnetic resonance data simultaneously acquired by the coils (by means of the reconstruction kernel), such that k-space does not need to be completely scanned and an acceleration of the acquisition can be achieved. The acquisition coils of such a coil array can have separate acquisition units (here the acquisition units 24 and 25), such that a raw data set with MR data can be acquired in parallel for each acquisition coil. The respective coil noise thereby remains essentially uncorrelated, such that a better SNR can be achieved. If correlations—for example between adjacent coils—should nevertheless occur, a pre-processing of acquired MR data for their decorrelation can thus take place.

ppa acquisition methods such as GRAPPA, SMASH or SENSE (for the implementation of which the shown magnetic resonance system can be configured) are known to those skilled in the art, such that additional details of these methods need not be described herein. The components of the magnetic resonance system that serve to acquire MR data (for example the units 14-17 and 22-25) are designated as an acquisition unit in the following.

The magnetic resonance system 100 is centrally controlled by the control unit 18. Control unit 18 controls the radiation of RF pulses and the acquisition of resulting MR signals. A reconstruction of image data from the raw MR data and a continuative processing of these take place in computer 19. Via an input unit 20 an operator can select a sequence program and input and modify imaging parameters that are displayed at a display 21.

The general functioning of an MR system is known to those skilled in the art, so a more detailed description of the general components is not necessary herein.

Control unit 18 controls the implementation of a ppa acquisition method. A reduced MR data set is thereby acquired in parallel for each of the acquisition coils (wherein FIG. 1 shows examples of acquisition coils 22 and 23). A reduced MR data set $s_k^{red}$ (k-space) or $l_k^{red}$ (image space) is a data set for which k-space was not completely scanned, i.e. in which k-space lines were omitted (index k designates the respective acquisition coil). It should be clear that, in addition to the omission of k-space lines, other accelerated acquisition methods also exist that (for example) implement a radial or spiral-shaped scanning so that k-space is scanned with a lower density in defined regions than in other regions. For example, the k-space data points to be scanned are determined by the field of view to be shown and the desired resolution of the resulting image data.

Since the acquisition of the reduced MR data sets takes place in parallel, the scanning scheme is normally the same for each data set, meaning that each data set has the same gaps or omissions. However, each coil has a different sensitivity profile, such that—for a coil—it is possible, by means of a reconstruction kernel for this coil, to complete the reduced MR data set that is acquired with this in that the reconstruction kernel reconstructs the missing MR data from the MR data sets acquired with all coils. For example, the reconstruction kernel can be a matrix whose elements represent weightings with which surrounding data points from all reduced MR data sets are weighted in the reconstruction of a missing data point (the elements of the reconstruction kernel have accordingly also been designated as weightings in the following). These weightings can be determined in advance via reference measurements, or can be determined directly from the acquired reduced MR data sets, for example in a self-calibrating method. This normally takes place in that a central k-space region is scanned completely (i.e. without omissions), for example, wherein the elements of the reconstruction kernel are then adapted such that the completely acquired k-space region is reconstructed correctly by the reconstruction kernel.

Computer 19 is designed in order to implement this determination of the reconstruction kernel, the application of this to the reduced MR data sets, and the transformation between k-space and image space. Computer 19 furthermore implements a reuse of the reduced MR data set acquired with an acquisition coil in the MR data set reconstructed for this coil. However, here the reuse does not takes place by the corresponding data point in the reconstructed MR data set being exchanged with the corresponding measured data point of the reduced MR data set; rather, both data points are combined with weighting corresponding to their respective variances. Data points of the reconstructed MR data set for which measured MR data exist are thus replaced here by a combination of these measured MR data and the reconstructed MR data.

An MR data set that was obtained by the application of the reconstruction kernel to the multiple reduced MR data sets is subsequently designated as a reconstructed MR data set. Missing MR data have already been at least partially reconstructed in this. If the reconstruction kernel has a sufficient size or if the omissions in the reduced data sets are correspondingly small, the reconstructed MR data set can already be a complete data set, i.e. a data set without additional gaps or, respectively, omissions. After the reuse of the actual acquired reduced MR data set or, respectively, of an MR data set determined in a preceding iteration step in the reconstructed MR data set, this is designated as a supplemented MR data set. This represents the result of the method (insofar as no additional iteration steps follow; otherwise, the result of the iteration step).

Figure 2:
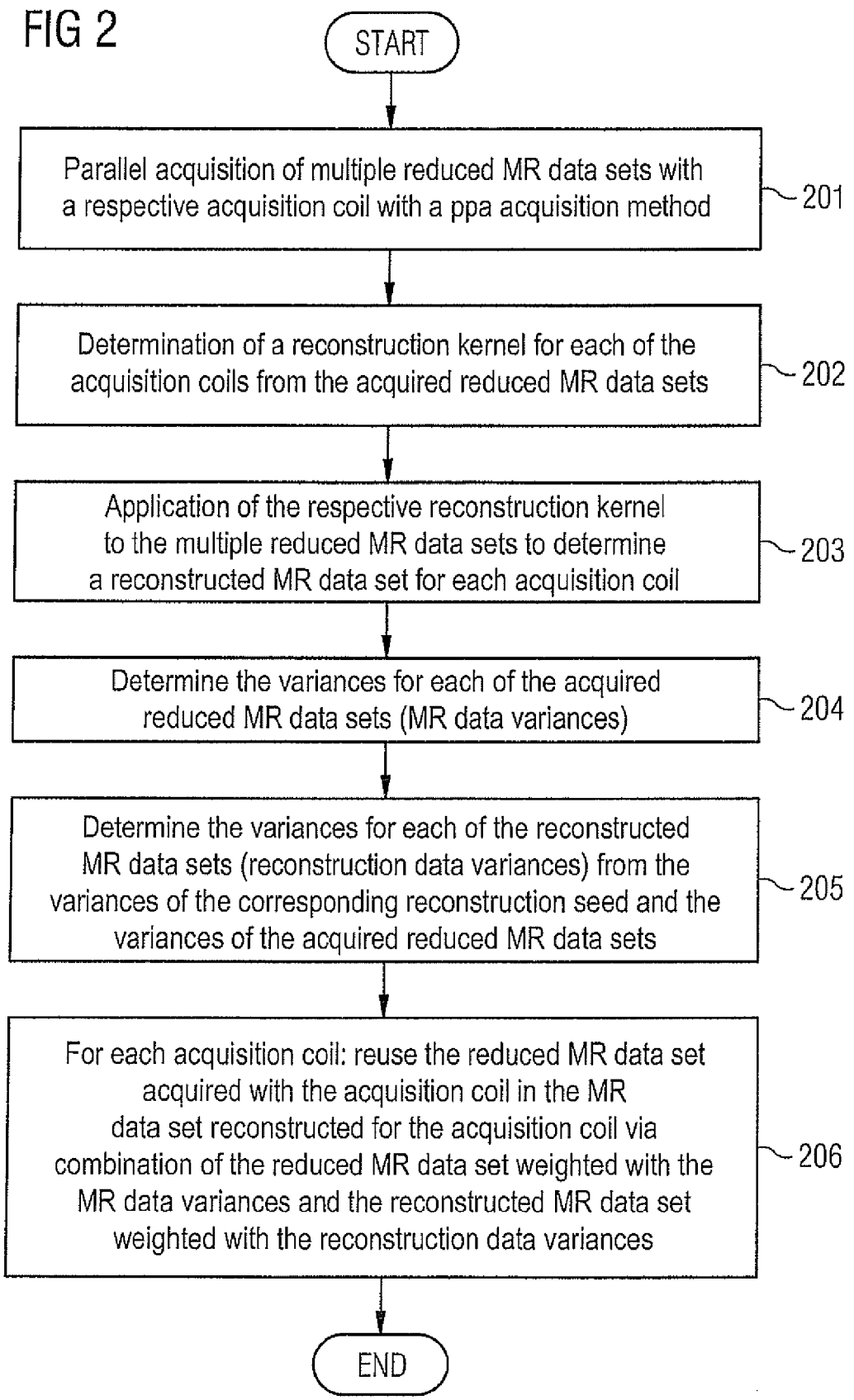
FIG. 2 shows a flow chart that illustrates a method according to one embodiment of the present invention.

FIG. 2 shows a flow chart that illustrates an embodiment of the method according to the invention which, for example, can be executed at a computer 19 of the magnetic resonance system 100. In Step 201 the parallel acquisition of multiple reduced MR data sets with a respective acquisition coil takes place with a ppa acquisition method. Given a self-calibrating ppa method, in Step 202 a reconstruction kernel for each of the acquisition coils is determined from the acquired reduced MR data sets, meaning that the weightings of the kernel are determined. In the method a GRAPPA reconstruction kernel is subsequently used as an example.

For each of the acquisition coils (index k), in Step 203 the respective reconstruction kernel is applied to the multiple reduced MR data sets to determine a reconstructed MR data set. In k-space this takes place by aliasing the GRAPPA kernel values $w_{kl}$ and the reduced k-space data $s_l^{red}$, wherein summation takes place over the coil index 1. The GRAPPA kernel can likewise be applied to the entirety of k-space in that the reduced MR data sets and the GRAPPA kernel are multiplied in image space and summed over the coils. In image space the matrix $W_{kl}$ of the transformed GRAPPA kernel weightings is thus multiplied with the reduced (or aliased) image data $l_l^{red}$ of the multiple acquisition coils and summed over the coil index 1. The reconstructed MR data set $t_k$ in k-space or the reconstructed MR data set $l_k^t$ in image space is thus obtained for the acquisition coil k according to:

$$t_k = \sum_{l=1}^{N} w_{kl} \otimes s_l^{red} \Rightarrow l_k' = \sum_{l=1}^{N} W_{kl} l_l^{red} \quad (1)$$

It is noted that the indices do not designate elements of the vectors or matrices but rather different instances of these vectors or matrices. k and l are respectively coil indices, wherein the reconstructed MR data set for coil k is based on the acquired data sets for all coils l=1 . . . N. Given N coils there are thus $N^2$ matrices $W_{kl}$.

The reconstruction matrices W in image space can be diagonal. It is correspondingly advantageous to store the image data l and matrices W as images and to implement a multiplication per element. For consistency, however, the vector/matrix formulation will continue to be used in the following.

Such a reconstruction by means of a GRAPPA kernel is described in the article "A general formulation for quantitative g-factor calculation in GRAPPA reconstructions", F. A. Breuerl et al., Intl. Soc. Mag. Reson. Med. 16 (2008), for example. However, no suitable reuse of the originally acquired MR data in the data reconstructed with the GRAPPA kernel takes place in the procedure described in this article.

Figure 5:
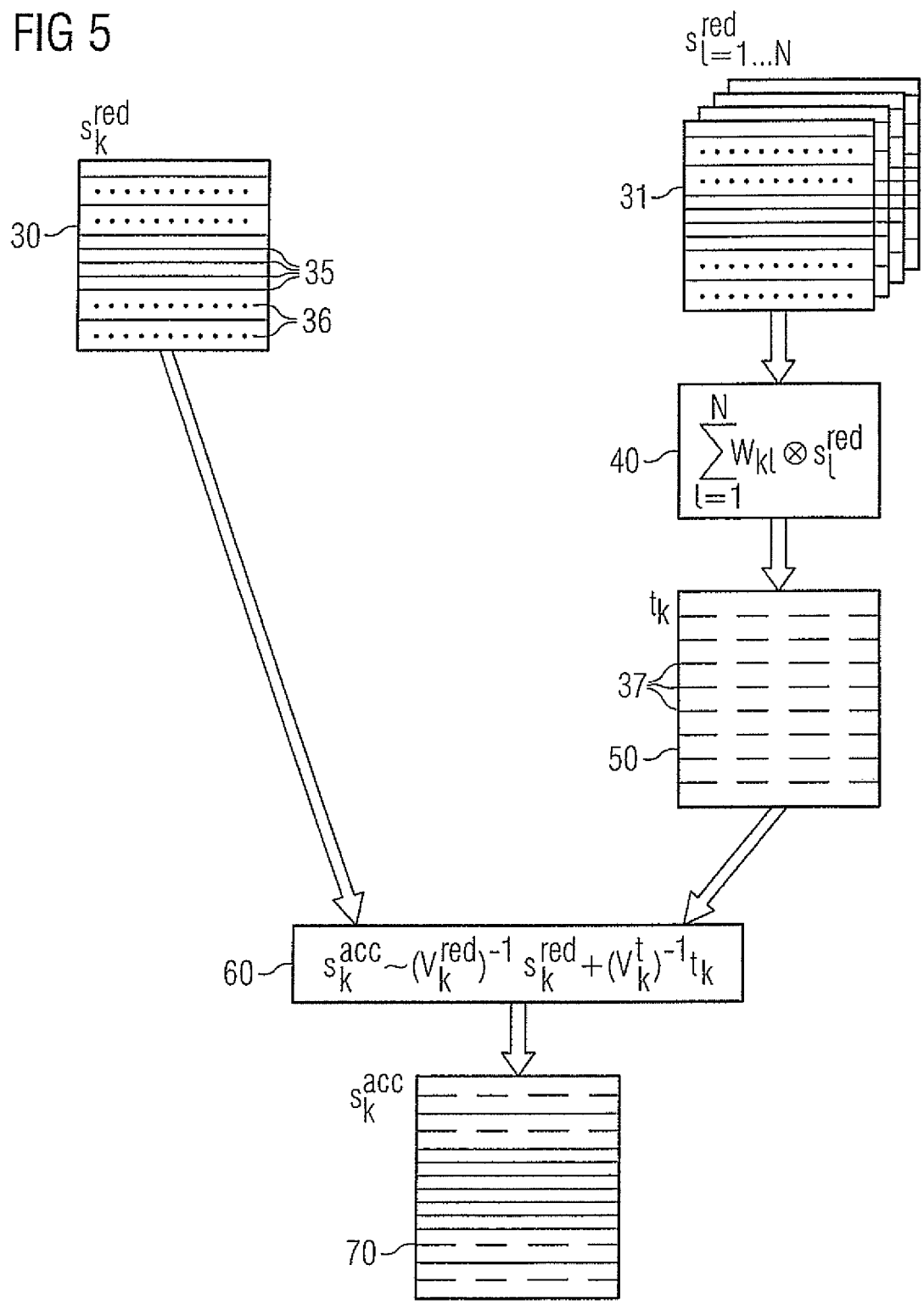
FIG. 5 illustrates the combination of an acquired reduced MR data set with a reconstructed MR data set given weighting with the corresponding variances.

The reconstruction is also graphically illustrated in FIG. 5. Reference character 30 identifies the reduced MR data set acquired with the coil k and reference character 31 identifies the acquired group of reduced MR data sets for the coils l=1 . . . N, wherein the data set 30 is comprised in this. By applying the reconstruction kernel 40 for the coil k to the multiple reduced data sets 31, the reconstructed MR data set $t_k$ 50 for this coil is obtained. It should be clear that the reconstructed MR data set can be determined for each of the N coils. The acquired reduced MR data sets include acquired MR data—here k-space lines 35—as well as data points for which no data were acquired (missing MR data) that here are represented in dots as omitted k-space lines 36. In FIG. 5 the reconstructed MR data are shown in dashed lines as reconstructed k-space lines 37.

In the method of FIG. 2, the determination of the variances for each of the acquired reduced MR data sets as MR data variances ($v_k^{red}$ in k-space or $V_k^{red}$ in image space) now takes place in Step 204. The determination of such variances is known to the man skilled in the art and should not be explained in detail here.

For each of the reconstructed MR data sets, in Step 205 variances are determined from the variances of the corresponding reconstruction kernel and the variances of the acquired reduced MR data sets (called reconstruction data variances $v_k^{\Sigma ws}$ and $V_k^{\Sigma WT}$ in the following). The reconstruction data variances can be determined with high precision by considering the variances of the reconstruction kernel. The determination is explained in more detail subsequently below.

A reuse of the reduced MR data set acquired with the acquisition coil now takes place in Step 206 in the MR data set reconstructed for the acquisition coil, which can in turn be implemented for each of the acquisition coils. The reuse takes place by combination of the reduced MR data set weighted with the MR data variances and the reconstructed MR data set weighted with the reconstruction data variances, for example according to $$s_k^{acc} = \quad (2)$$

$$\left((v_k^{red})^{-1} + (v_{kl}^{\Sigma ws})^{-1}\right)^{-1} \left((v_k^{red})^{-1} s_k^{red} + (v_k^{\Sigma ws})^{-1} \sum_{l=1}^{N} w_{kl} \otimes s_l^{red}\right) \Rightarrow I_k^{acc} =$$

$$\left((V_k^{red})^{-1} + (V_{kl}^{\Sigma Wl})^{-1}\right)^{-1} \left((V_k^{red})^{-1} I_k^{red} + (V_k^{\Sigma Wl})^{-1} \sum_{l=1}^{N} W_{kl} I_l^{red}\right)$$

for k-space or for image space. The reduced data sets $s^{red}$ or $l^{red}$ can be filled with zeroes for unmeasured data points. The variances for these data are determined by the noise for each acquired data point and can be set to very high values for unscanned data points. For unscanned data points, for example, the variances can be set to a value that corresponds to the value of a central k-space point or can be adapted according to a model (for example, the variance values can decrease from the center of k-space outward). It is thereby ensured that the unmeasured data points in the reduced MR data sets are only slightly weighted in the combination.

The supplemented MR data set $s_k^{acc}$ (k-space) or $l_k^{acc}$ (image space) for the coil k can thus be determined with improved precision since data points with high variances are only slightly weighted in the combination. As Equation (2) shows, the reconstruction by means of the reconstruction kernel and the combination can essentially take place simultaneously.

The variances v and V can be complete covariance matrices that contain the variances on the principal diagonals and covariances in the additional matrix elements. An increased precision can be achieved by considering the covariances. However, it is also possible to use only the variances—thus diagonal covariance matrices—in order to simplify the method.

The combination to determine the supplemented MR data set is illustrated by the block 60 in FIG. 5, wherein here the sum of the reconstruction kernel weightings and reduced MR data sets that represent the respective reconstructed MR data set was replaced with the symbol $t_k$. The resulting supplemented MR data set 70 now contains a mixture of acquired and reconstructed MR data, wherein those with the smaller variance for the respective data point predominate. Moreover, the data set is now complete, meaning that MR data exist for each predetermined k-space point.

The variances of the reconstructed MR data set are discussed briefly in the following. For example, the data set can be two-dimensional or three-dimensional, this comprise image points in the form of pixels or voxels. In the three-dimensional case, a defined voxel that is generated in image space by the GRAPPA kernel is the result of a multiplication of a signal value with an element of the reconstruction kernel and a sum over the coils according to:

$$\left[\sum_{l=1}^{N} W_{kl} I_l^{red}\right]_i = \sum_{l=1}^{N} [W_{kl}]_{ii} [I_l^{red}]_i \quad (3)$$

In the case of conventional methods, it is often assumed that the elements of the reconstruction kernel are correct and have no errors. In such cases, the variances of the reconstructed MR data set are defined by a weighted sum of the variances of the reduced MR data sets. In the present embodiment, however, errors of the elements of the reconstruction kernel are taken into account and evaluated.

Under the assumption that the reduced MR data sets and the GRAPPA kernel have independent Gaussian probability density distributions, such that these have average values $\mu_l^{red} = I_l^{red}$ and $\mu_{kl}^{W} = W_{kl}$ as well as diagonal variance matrices $V_l^{red}$ and $V_{kl}^{W}$, their multiplication has the following average values and variances:

$$[\mu_k^{\Sigma Wl}]_i = \sum_{l=1}^{N} [W_{kl}]_{ii} [I_l^{red}]_i \quad (4)$$

$$[V_k^{\Sigma Wl}]_{ii} = \sum_{l=1}^{N} [V_{lk}^{Wl}]_{ii}$$

$$[V_{lk}^{Wl}]_{ii} =$$

$$[V_{lk}^{W}]_{ii}[V_i^{red}]_{ii} + [V_{lk}^{W}]_{ii}[I_l^{red}]_i[I_l^{red}]_i^* + [W_{kl}]_i[W_{kl}]_i^*[V_l^{red}]_{ii}$$

The assumption that the variance matrices for the entries of the GRAPPA kernel are diagonal is naturally only an approximation. The analysis of the elements of the GRAPPA kernel that is described here later provides the covariances for the different entries $w_k$. It should be taken into account, however, that GRAPPA kernels have a compact shape in k-space but not in image space. A tracking of the effects of the covariances in image space can be very costly with regard to the required computing power.

It can be established, however, that scanning takes place with the same k-space trajectory with each coil. Furthermore, the noise can be normalized and—if the same variances are used a priori for each coil—then the variance matrices $V_l^{red}$ ultimately determined for each coil l are also the same. A simplification of the calculation can thus be achieved.

As mentioned above, the variances of the originally acquired k-space data are provided by the noise for each acquired data point and very large variances for unsampled k-space points. An expression of the k-space variances of the GRAPPA kernel elements can similarly be found, as is shown at the end hereof. In order to transform these variance matrices in image space, a matrix formulation of the Fourier transformation (FFT) can be used. Via the matrix FFT, a k-space data set (s) can be transformed into an image space data set (l) and a k-space variance (v) can be transformed into an image space variance (V) according to:

I=FFT s

V=FFT v FFT$^H$ (5)

wherein the superscript H designates the complex transpose.

The variances of the elements of the reconstruction kernel (both in image space) are furthermore required in order to determine the variances of the reconstructed MR data set in image space. This is described in detail further below.

Figure 3:
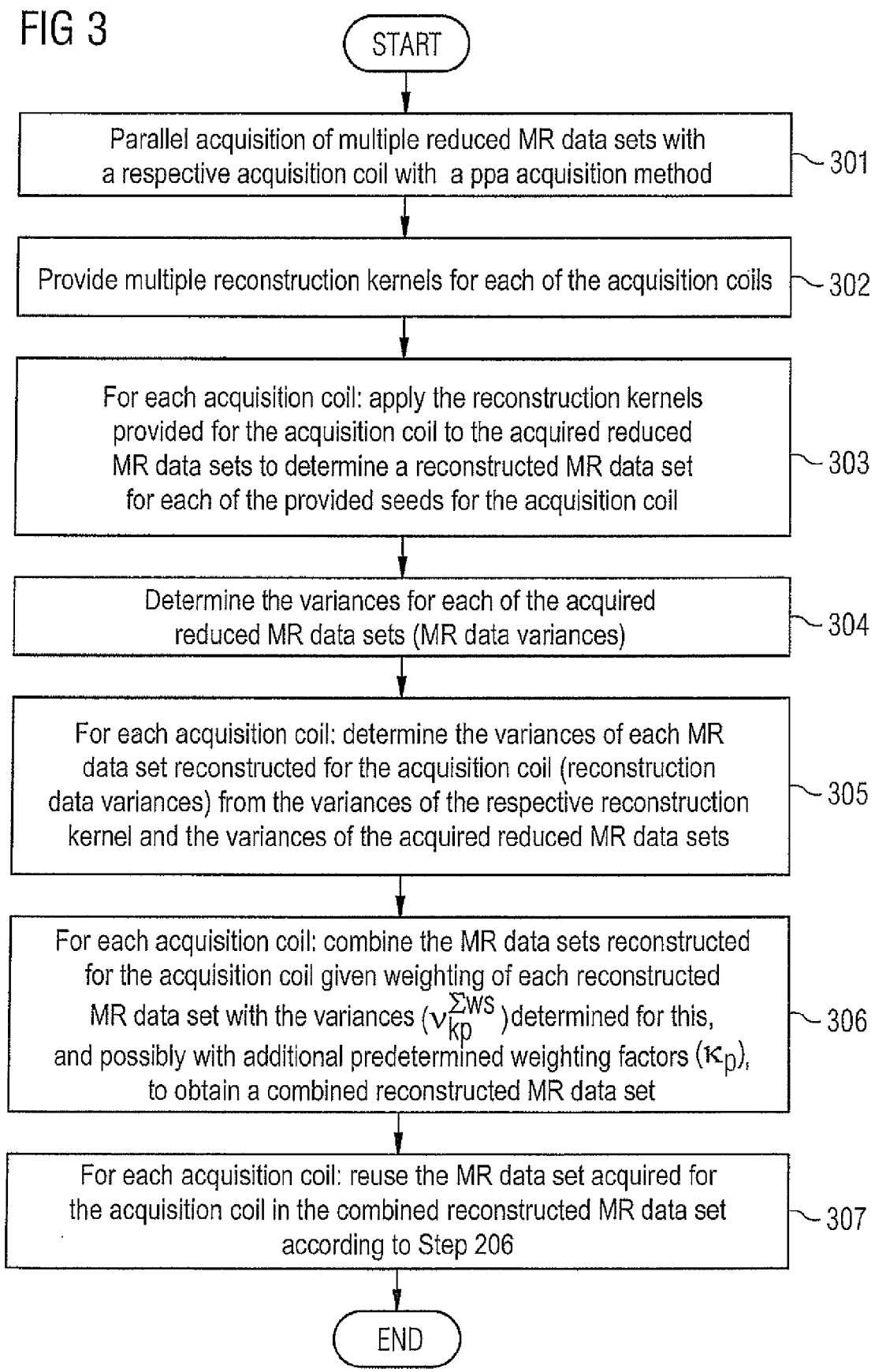
FIG. 3 shows a flow chart that illustrates a method according to one embodiment of the present invention.

FIG. 3 shows an additional embodiment of the method according to the invention, which can in turn be executed at the magnetic resonance system 100 of FIG. 1. Multiple different reconstruction kernels are thereby used to reconstruct missing k-space data. The MR data sets reconstructed with different reconstruction kernels for a coil are subsequently in turn combined given weighting with the respective variances.

In the method of FIG. 3, the parallel acquisition of multiple reduced MR data sets initially takes place in turn with a ppa acquisition method (Step 301) with a respective acquisition coil. In Step 302, multiple reconstruction kernels are provided for each of the acquisition coils. For example, these can be reconstruction kernels of different sizes. For example, the size thereby determines which points of the kernel to add for reconstruction of a data point. For example, the mask can be a 1/10 mask that identifies the data points that are used in the reconstruction. A smaller kernel—for example for reconstruction of a data point in the data set of a specific coil—can use the respective point above and below this data point from the data sets of all coil for reconstruction, while a larger kernel uses the adjacent points above and below as well as to the right and left for reconstruction.

For a specific reconstruction kernel, the weightings of the kernel can then be determined for each coil, for example by means of a self-calibration method according to which a reconstruction kernel is available for each coil (characterized by index k).

In Step 303, for each acquisition coil k the reconstruction kernels (index p=1 ... P) provided for the acquisition coil are applied to the acquired reduced MR data sets in order to determine a reconstructed MR data set for each of the provided kernels for this acquisition coil. This is illustrated for the acquisition coil k in FIG. 6. For this the reconstruction kernels $RK1_k$-$RK3_k$—which are identified with the reference characters 41-43—are provided. These are respectively applied to the acquired reduced image data sets $s_l=1 \ldots N^{red}$. For each kernel a reconstructed MR data set $t_{k1}$, $t_{k2}$ or, respectively, $t_{k3}$ is thus obtained. The application of the reconstruction kernel can take place as described above with reference to FIGS. 2 and 5, thus for example by an aliasing of the kernel weightings $W_{klp}$ with the k-space data, or by a summation over the image space data multiplied with the kernel weightings $W_{klp}$.

The variances for each of the acquired reduced MR data sets (as MR data variances are then determined in Step 304. The determination of the variances of each MR data set reconstructed for the acquisition coil as reconstruction data variances takes place in Step 305 from the variances of the respective reconstruction kernel and the variances of the acquired reduced MR data sets. The determination of the variances of the reconstructed MR data sets can in turn take place as above with reference to FIGS. 2 and 5 or as is described in detail in the following.

Figure 6:
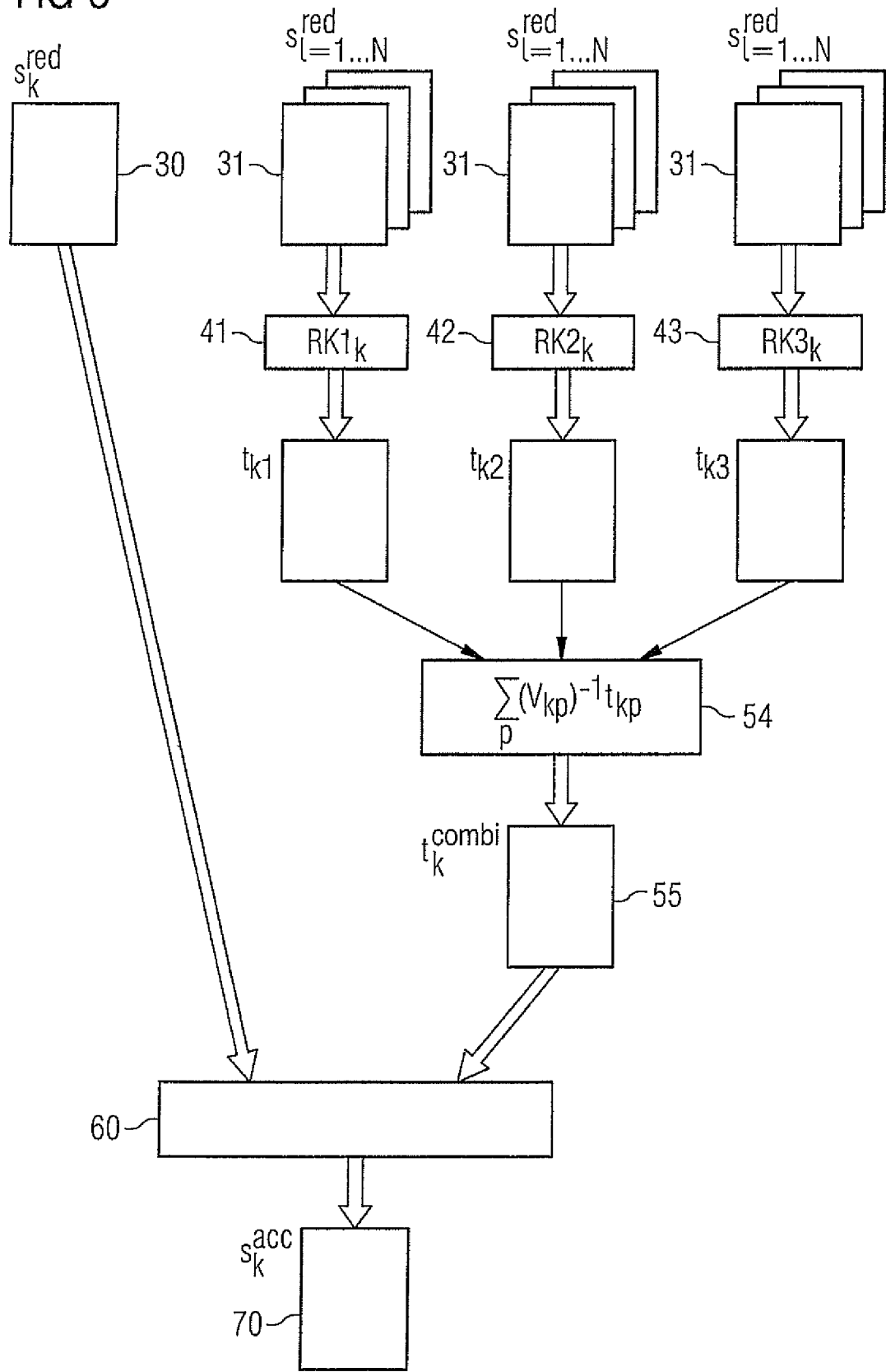
FIG. 6 illustrates the reconstruction for MR data sets using different reconstruction kernels for the same acquisition coil and the combination of these among one another, as well as with an acquired reduced MR data set.

The reconstructed MR data sets determined for the acquisition coil k are subsequently combined in Step 306 given weighting with their respective variances. In particular, each reconstructed MR data set can be weighted with the variances determined for these—and possibly with additional, predetermined weighting factors—in order to obtain a combined reconstructed MR data set. Data points with higher variances are thereby weighted less. This combination is illustrated in FIG. 6 with block 54, wherein the combined reconstructed MR data set $t_k^{combi}$ has the reference character 55. Such a procedure is in particular advantageous if it is unclear which reconstruction kernel delivers a suitable reconstruction of missing MR data in a specific situation, i.e. given the presence of a specific scanning scheme. Through the application of multiple different reconstruction kernels and subsequent combination given weighting with the respective variances it can be ensured that the best suited reconstruction kernel for each data point significantly contributes to the reconstructed data point. The reconstruction precision can thus be significantly improved.

A reuse of the MR data set acquired with this acquisition coil k takes place in Step 307 in the combined reconstructed MR data set determined for acquisition coil k. This reuse is implemented for each acquisition coil k=1 ... N. The reuse can take place according to Step 206 of FIG. 2 and the explanations provided in this regard. The reuse thus likewise takes place via combination given weighting with the respective variances. This is likewise illustrated in FIG. 6, where the reduced MR data set $s_k^{red}$ (reference character 30) is used in the combined reconstructed MR data set 55 (Block 60), wherein the supplemented R data set $s_k^{acc}$ (reference character 70) results. However, Step 307 is optional; the combined reconstructed MR data set can also be used directly.

It should be clear that only a functional division of the procedure upon combination of the multiple reconstructed MR data sets and the originally acquired reduced MR data set is shown in FIGS. 3 and 6. The combination in Steps 306 and 307 (or, respectively, in Blocks 54 and 60) advantageously takes place in one step without having to explicitly determine the combined reconstructed MR data set 55. An explicit determination of the reconstructed MR data sets $t_{k1}$-$t_{k3}$ is likewise not necessary. For example, the determination of the supplemented MR data set for the acquisition coil k can take place in k-space or, respectively, image space according to the Equations $$s_k^{acc} = \left( (v_k^{red})^{-1} + \sum_{p=1}^{P} (v_{kp}^{\Sigma ws})^{-1} \right)^{-1} \tag{6}$$

$$\left( (v_k^{red})^{-1} s_k^{red} + \sum_{p=1}^{P} (v_{kp}^{\Sigma ws})^{-1} \sum_{l=1}^{N} w_{klp} \otimes s_l^{red} \right)$$

$$\Rightarrow I_k^{acc} = \left( (V_k^{red})^{-1} + \sum_{p=1}^{P} (V_{kp}^{\Sigma WI})^{-1} \right)^{-1}$$

$$\left( (V_k^{red})^{-1} I_k^{red} + \sum_{p=1}^{P} (V_{kp}^{\Sigma WI})^{-1} \sum_{l=1}^{N} W_{klp} I_l^{red} \right).$$

p here designates the index of the respectively used reconstruction kernel. The sum over the coil index l=1 ... N thus represents the reconstructed MR data set for the reconstruction kernel p, in contrast to which the sum $$\sum_{p=1}^{P} \ldots$$

(wherein P indicates the maximum number of the reconstruction kernels) represents the combined reconstructed MR data set. As is clear from this formulation, both the reconstructed MR data sets and the reduced MR data set are respectively weighted with their variances. Naturally, here the possibility also exists to either use only the variances or to also use complete covariance matrices that account for correlations.

As was already described with regard to Step 306, additional predetermined weighting factors can be used in the combination. These can be application-specific weightings or be weightings $k_p$ based on experiences. In one embodiment, such additional weighting factors are used in order to achieve a higher confidence for interpolating reconstruction kernels, i.e. reconstruction kernels in which a voxel or pixel is reconstructed from data that lie on a closed area or, respectively, closed contour around the data point to be reconstructed. Extrapolating reconstruction kernels that, for example, consider only data to one side of the point to be reconstructed can thus be weighted less than interpolations. Furthermore, these weighting factors can be used in order to reduce the contribution of the complete reconstructed data sets in comparison to the originally acquired reduced MR data sets. This can in particular be important if a large number of reconstruction kernels is used. Otherwise, the MR data sets (which do not have independent errors) reconstructed with the plurality of reconstruction kernels can possibly receive too high a weighting relative to the originally acquired data in the determination of the supplemented MR data set, solely due to said high number. For example, the weighting factor can be set to $k_p=1/P$ (P is equal to the number of reconstruction kernels). Equations (6) can thus be written as:

$$s_k^{acc} = \left((v_k^{red})^{-1} + \sum_{p=1}^{P} K_p (v_{kp}^{\Sigma ws})^{-1}\right)^{-1} \quad (7)$$

$$\left((v_k^{red})^{-1} s_k^{red} + \sum_{p=1}^{P} K_p (v_{kp}^{\Sigma ws})^{-1} \sum_{l=1}^{N} w_{klp} \otimes s_l^{red}\right)$$

$$\Rightarrow I_k^{acc} = \left((v_k^{red})^{-1} + \sum_{p=1}^{P} K_p (V_{kp}^{\Sigma Wl})^{-1}\right)^{-1}$$

$$\left((V_k^{red})^{-1} I_k^{red} + \sum_{p=1}^{P} K_p (V_{kp}^{\Sigma Wl})^{-1} \sum_{l=1}^{N} W_{klp} I_l^{red}\right)$$

If the variances of the originally acquired reduced MR data sets and the elements of the reconstruction kernels are determined as described above and in the following, the variance of the weighted sum can be determined as:

$$[V_k^{acc}]_{ii} = \left([V_k^{red}]_{ii}^{-1} + \sum_{p=1}^{P} K_p \right. \quad (8)$$

$$\left. \left(\sum_{l=1}^{N} [V_{lk}^{W}]_{ii} [V_l^{red}]_{ii} + [V_{lk}^{W}]_{ii} [I_l^{red}]_i [I_l^{red}]_i^* + [W_{kl}]_i [W_{kl}]_i^* [V_l^{red}]_{ii}\right)^{-1}\right)^{-1}$$

In this more complex case, the variance of the supplemented MR data set obtained as a result can thus also be determined. The variances of the result can likewise contribute to the improvement of the method, as is described in detail in the following.

Via the application of multiple reconstruction kernels, it is thus essentially possible to implement an automatic selection of the best suited reconstruction kernel. A suitable reconstruction of missing MR data can thus be enabled for arbitrary k-space trajectories.

However, it can furthermore occur that one or also multiple reconstruction kernels are "too small" in order to reconstruct all missing MR data in the acquired MR data sets. In this case the methods described in the preceding can be applied iteratively.

Figure 4:
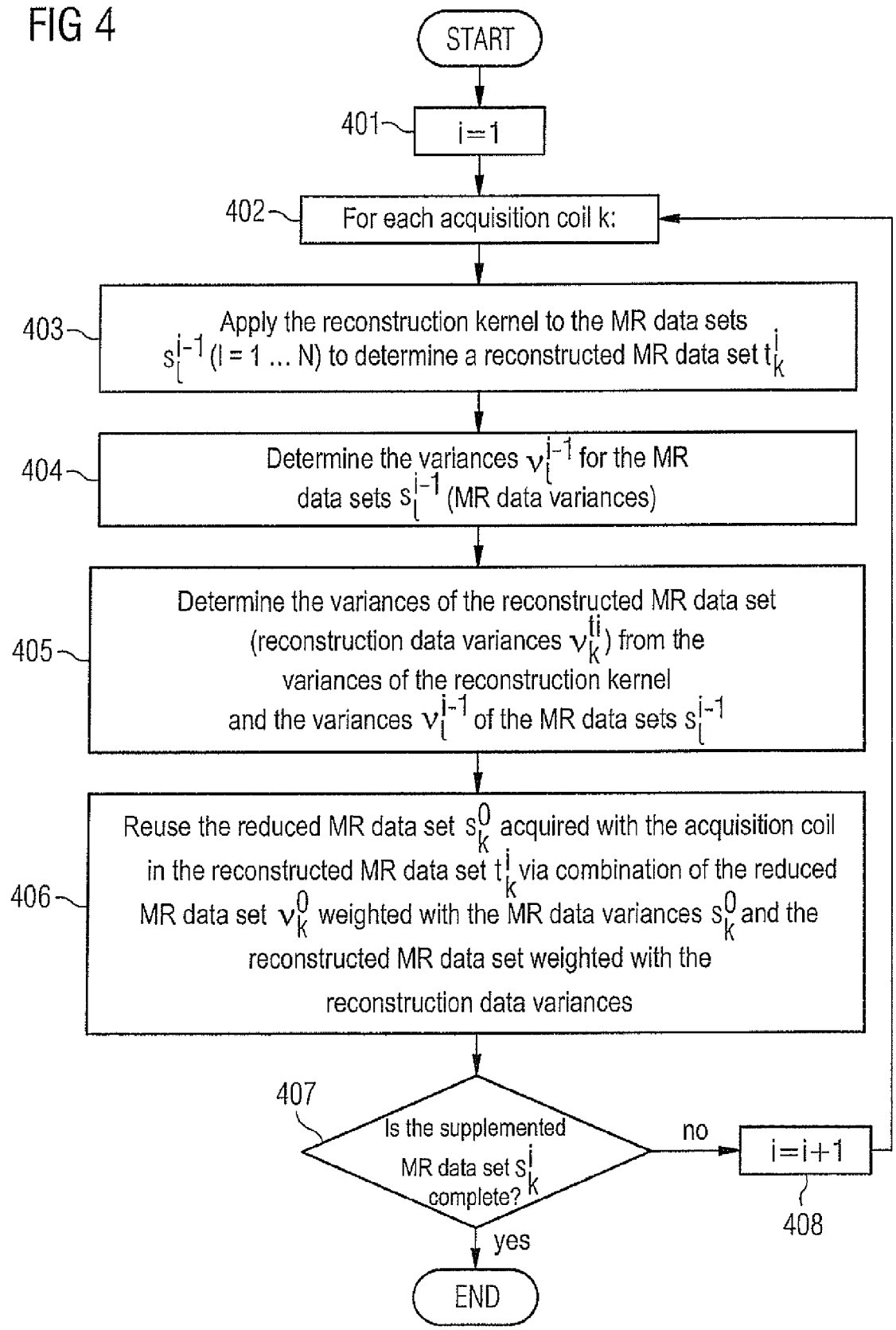
FIG. 4 shows a flow chart of an embodiment of the method according to the invention in which one or more reconstruction kernels are applied iteratively.

This is illustrated in the exemplary embodiment of FIG. 4, wherein the method of FIG. 4 can in turn be executed at the MR system 100 of FIG. 1 and be combinable with the methods of FIGS. 2 and 3. It is assumed that multiple reduced MR data sets were again acquired in parallel, and that one or more reconstruction kernels are provided for each acquisition coil. The method begins with the first iteration step i=1 (Step 401). The method for each of the acquisition coils is implemented in each iteration step (Step 402). A supplemented MR data set is thus determined for each coil as a result of the iteration step, wherein this group of supplemented MR data sets for the multiple coils subsequently forms the basis of the next iteration step. In Step 403 the reconstruction kernel is applied to the MR data sets $s_l^{i-1}$ (or $l_l^{i-1}$) to determine a reconstructed MR data set $t_k^i$ for the iteration step. i=0 designates the originally acquired reduced MR data sets that are used in the first iteration step. If multiple reconstruction kernels are used per acquisition coil, these can be applied in Step 403 to determine multiple reconstructed MR data sets.

In Step 404 the variances for the MR data sets $s_l^{i-1}$ are determined as MR data variances. In the first iteration step, these are the variances of the originally acquired reduced MR data sets ($v_l^0$). These can be used in the reuse of the originally acquired MR data sets, as well as to determine the variances of the reconstructed MR data set in the next Step 405. These reconstruction data variances $v_k^{ti}$ (wherein i indicates the iteration index) are determined from the variances of the reconstruction kernel and the variances of the MR data sets $s_l^{i-1}$ used in the iteration step. Given a use of multiple reconstruction kernels per acquisition coil, this can in turn take place for each reconstruction kernel, meaning that an additional index p is used.

In Step 406 the reuse of the reduced MR data set $s_k^0$ (acquired with the acquisition coil) in the reconstructed MR data set $t_k^i$ takes place via combination given weighting with the respective variances determined for these. Here it is again possible to use additional predetermined weighting factors or—given the use of multiple reconstruction kernels—to implement the simultaneous combination of the multiple reconstructed MR data sets and the acquired reduced MR data set given weighting with the respective variances as described above (Equations 6 or, respectively, 7). Alternatively, it is likewise conceivable to not reuse the acquired reduced MR data set $s_k^0$, but rather to reuse the result of the preceding iteration step (i.e. the MR data set $s_k^{i-1}$ or, respectively, $l_k^{i-1}$). If an MR data point was reconstructed with high precision (i.e. with smaller variances) in an iteration step, this can be maintained in subsequent iteration steps due to the weighting with the corresponding variance.

In decision Step 407 it is subsequently checked whether the result of the iteration step—i.e. the supplemented $s_k^i$ or, respectively, $l_k^i$—is complete. If it is not complete, the iteration index is increased (Step 408) and an additional iteration step takes place. Here each iteration step is implemented for all acquisition coils k=1 ... N since the results of the iteration step for each acquisition coil forms the basis for the determination of the reconstructed MR data set in Step 403.

If the supplemented MR data set is complete, the method ends. A supplemented complete MR data set is thus obtained that has optimally small variances. In that the originally acquired data or, respectively, the result of the preceding iteration step (in which the originally acquired data are normally likewise strongly weighted) is reused in each iteration step, the quality of the reconstructed data is also not degraded over multiple iteration steps. Larger omissions or, respectively, gaps in the acquired reduced MR data sets can thus also be closed without this leading to proliferating variances.

Figure 7:
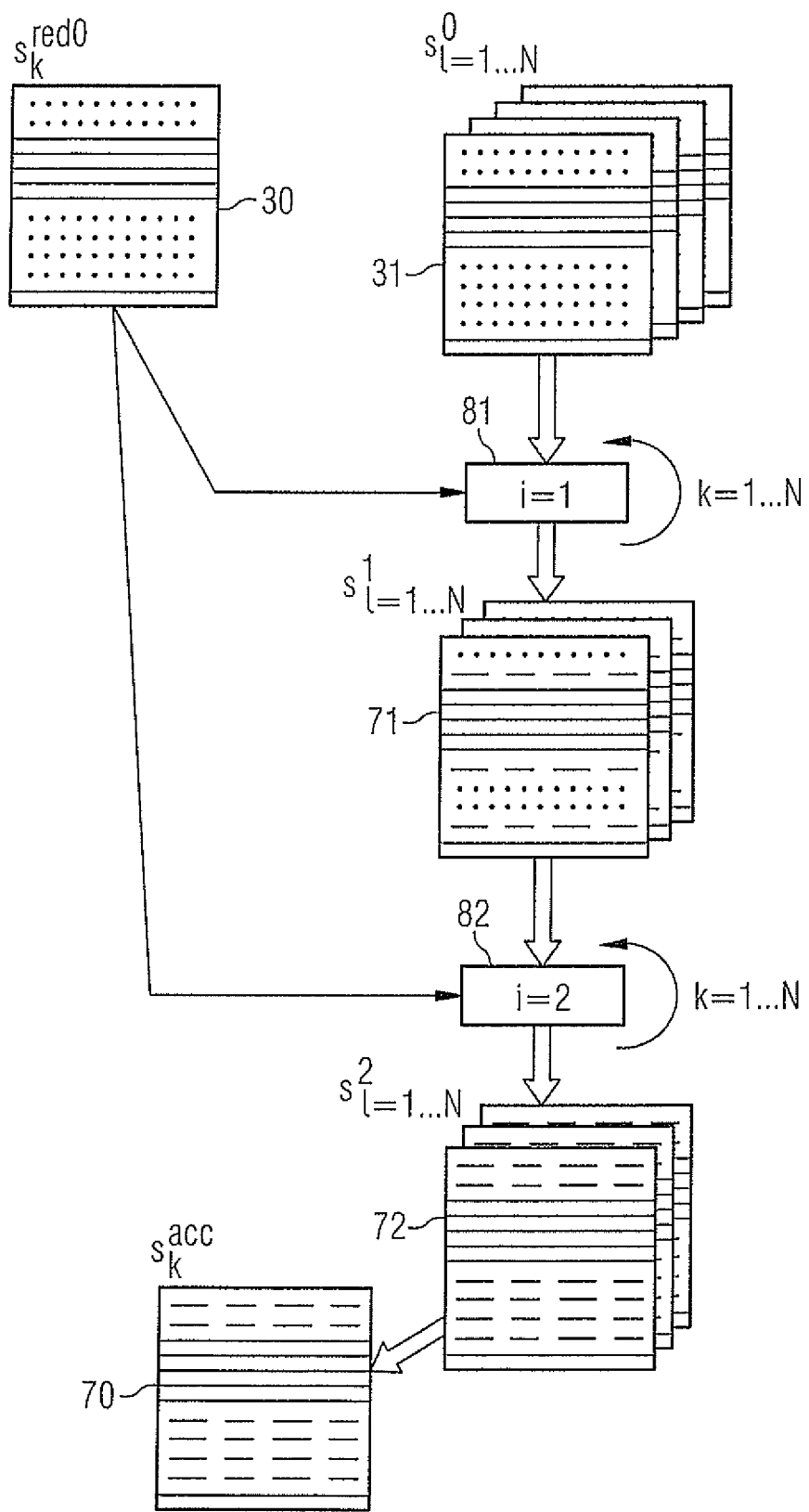
FIG. 7 illustrates the iterative application of a reconstruction kernel to an acquired MR data set.

The closing of the gaps of the acquired data sets is illustrated in an example with the iterative method in FIG. 7. The acquired reduced MR data sets 31 here each have more omitted k-space lines (dotted), wherein in other acquisition methods the undersampling can naturally also lead to different types of omissions. The MR data sets 71, resulting after the first iteration step 81 which is executed for all acquisition coils k=1 . . . N, are still incomplete. Although they are supplemented relative to the original data sets 31 (represented by the dashed, reconstructed k-space lines), they still have omissions. In the iteration step 81 the originally acquired reduced MR data sets are reused. The second iteration step 82 uses the supplemented MR data sets 71 of the preceding iteration step as an input and in turn generates the supplemented MR data sets 72 via application of the reconstruction kernels and via reuse of the originally acquired MR data sets. All missing MR data are now reconstructed in these. Since the reuse was already implemented in the iteration step, these data sets already represent the result of the method. The complete supplemented data set $s_k^{acc}$ (reference character 70) is therefore determined for each coil k.

It should be clear that the reuse as well as the determination of the variances can take place as described in more detail above (with reference to FIGS. 2 and 3 or, respectively, 5 and 6) and in the following.

In particular, the methods that are shown can be combined. For example, multiple reconstruction kernels can be used for each acquisition coil in each iteration step. The determination of the supplemented MR data sets $s_k^i$ as a result of each iteration step can then take place according to $$s_k^i = \left( (v_k^0)^{-1} + \sum_{p=1}^{P} K_p^i (v_{kpi}^{\Sigma ws})^{-1} \right)^{-1} \tag{9}$$

$$\left( (v_k^0)^{-1} s_k^0 + \sum_{p=1}^{P} K_p^i (v_{kpi}^{\Sigma ws})^{-1} \sum_{l=1}^{N} w_{klp} \otimes s_l^{i-1} \right)$$

$$\Rightarrow I_k^i = \left( (V_k^0)^{-1} + \sum_{p=1}^{P} K_p^i (V_{kpi}^{\Sigma Wl})^{-1} \right)^{-1}$$

$$\left( (V_k^0)^{-1} I_k^0 + \sum_{p=1}^{P} K_p^i (V_{kpi}^{\Sigma Wl})^{-1} \sum_{l=1}^{N} W_{klp} I_l^{i-1} \right)$$

for k-space or, respectively, image space, wherein the originally acquired MR data sets are reused in this example. In the above example, additional weighting factors $k_p^i$ were likewise used that can be configured as described above; in particular, extrapolating or interpolating kernels can thus be weighted differently or the weighting of the reconstructed MR data sets can be reduced relative to the originally acquired data sets. If the result of the preceding iteration step is reused, the following expressions result for the determination of the supplemented MR data sets of the iteration step i:

$$s_k^i = \left( (v_k^{i-1})^{-1} + \sum_{p=1}^{P} K_p^i (v_{kpi}^{\Sigma ws})^{-1} \right)^{-1} \tag{10}$$

$$\left( (v_k^{i-1})^{-1} s_k^{i-1} + \sum_{p=1}^{P} K_p^i (v_{kpi}^{\Sigma ws})^{-1} \sum_{l=1}^{N} w_{klp} \otimes s_l^{i-1} \right)$$

$$\Rightarrow I_k^i = \left( (V_k^{i-1})^{-1} + \sum_{p=1}^{P} K_p^i (V_{kpi}^{\Sigma Wl})^{-1} \right)^{-1}$$

$$\left( (V_k^{i-1})^{-1} I_k^{i-1} + \sum_{p=1}^{P} K_p^i (V_{kpi}^{\Sigma Wl})^{-1} \sum_{l=1}^{N} W_{klp} I_l^{i-1} \right)$$

The designation $\Sigma ws$ or, respectively, $\Sigma Wl$ here is again used as an identifier for reconstructed MR data sets, in particular their variances, in contrast to which the symbol t is used as an abbreviation to label them in the drawings. Given repeated application of the reconstruction kernel, the variances or, respectively, errors in the elements of the reconstruction kernels are thus accounted for here. This leads to a more precise supplementation of the acquired reduced MR data sets. A further improvement can be achieved in that covariances between the variances of the elements of the reconstruction kernel are taken into account. A summation of errors that occurs under the circumstances thus can be avoided.

Here the variances of the supplemented MR data sets determined with each iteration step can also be determined, and in fact according to:

$$V_k^i = \left( (V_k^0)^{-1} + \sum_{p=1}^{P} K_p^i \right. \tag{11}$$

$$\left. \left( \sum_{l=1}^{N} [V_{lk}^W]_{ii} [V_l^{i-1}]_{ii} + [V_{lk}^W]_{ii} [I_l^{i-1}]_i [I_l^{i-1}]_i^* + [W_{kl}]_i [W_{kl}]_i^* [V_l^{i-1}]_{ii} \right)^{-1} \right)^{-1}$$

These variances apply for a repeated use of the originally acquired reduced MR data sets. If the results of the preceding iteration step are reused, the variances are determined as $$V_k^i = \left( (V_k^{i-1})^{-1} + \sum_{p=1}^{P} K_p^i \right. \tag{12}$$

$$\left. \left( \sum_{l=1}^{N} [V_{lk}^W]_{ii} [V_l^{i-1}]_{ii} + [V_{lk}^W]_{ii} [I_l^{i-1}]_i [I_l^{i-1}]_i^* + [W_{kl}]_i [W_{kl}]_i^* [V_l^{i-1}]_{ii} \right)^{-1} \right)^{-1}$$

In the case of the application of multiple, different iteration kernels for each acquisition coil, a very high demand for working memory can occur, in particular given a reconstruction in image space. Both in the simple method described with reference to FIGS. 3 and 6 (for the combination of the MR data sets reconstructed with different kernels) and in the method specified in Equations 9 and 10 (in which the combination takes place in each iteration step), for simplification it is possible to implement the combination of reconstructed MR data sets in pairs. This can again take place iteratively. In each iteration step an additional reconstructed MR data set is thereby added to the result of the preceding iteration step. For example, this can take place for each iteration step according to the Equations $$s_{kp}^i = \left( (v_{kp-1}^i)^{-1} + K_p^i (v_{kpi}^{\Sigma ws})^{-1} \right)^{-1} \tag{13}$$

-continued $$\left( (v^i_{kp-1})^{-1} s^j_{kp-1} + K^i_p (v^{\Sigma ws}_{kpi})^{-1} \sum_{l=1}^{N} w_{klp} \otimes s^{j-1}_{lp} \right)$$

$$\Rightarrow I^i_{kp} = \left( (V^i_{kp-1})^{-1} + K^i_p (V^{\Sigma Wl}_{kpi})^{-1} \right)^{-1}$$

$$\left( (V^i_{kp-1})^{-1} I^i_{kp-1} + K^i_p (V^{\Sigma Wl}_{kpi})^{-1} \sum_{l=1}^{N} W_{klp} I^{i-1}_{lp} \right)$$

for k-space and image space, respectively. It is noted that here that iteration initially takes place over the index p that identifies the respective reconstruction kernel, wherein in each iteration step the supplemented MR data set determined with the preceding reconstruction kernel is combined with the MR data set reconstructed with the current reconstruction kernel. The supplemented MR data sets $s_{kp}^i$ determined with the last iteration step deliver the result of the combination. i=0 again designates the originally acquired reduced MR data sets or, respectively, their variances. If the multiple reconstruction kernels should be applied multiple times, this per pair combination takes place in each iteration step i.

Each reconstruction kernel should lead to the same image data or, respectively, k-space data, within the standard deviations of the respective reconstruction. Therefore a ratio X can be determined for each image point (each pixel or voxel, for example) such that:

$$X = \frac{\left[ I^i_{kp-1} - \sum_{l=1}^{N} W_{klp} I^{i-1}_{lp} \right]_i}{\sqrt{[V^i_{kp-1} + V^{\Sigma Wl}_{kpi}]_{ii}}} = \frac{\left[ s^j_{kp-1} - \sum_{l=1}^{N} w_{klp} \otimes s^{j-1}_{lp} \right]_i}{\sqrt{[v^i_{kp-1} + v^{\Sigma ws}_{kpi}]_{ii}}} \quad (14)$$

wherein the interval X measures the interval between data points in units of standard deviations. If this measure is large, it is thus probable that the reconstruction model does not operate without errors. Here—thus via a comparison of the MR data set reconstructed with a reconstruction kernel with a combined reconstructed MR data set (using the multiple reconstruction kernels)—it can be determined whether this reconstruction kernel has a sufficient reconstruction precision. It is also possible to determine the probability that two data points have a defined distance X, and in fact according to $$P\left( \left[ I^i_{kp-1} - \sum_{l=1}^{N} W_{klp} I^{i-1}_{lp} \right]_{ii}, [V^i_{kp-1}]_{ii'}, [V^{\Sigma Wl}_{kpi}]_{ii} \right) = \quad (15)$$

$$(2\pi)^{-1} [V^i_{kp-1} + V^{\Sigma Wl}_{kpi}]_{ii}^{-1} \text{Exp}$$

$$\left[ -\frac{1}{2} \left[ I^i_{kp-1} - \sum_{l=1}^{N} W_{klp} I^{i-1}_{lp} \right]_i^* [V^i_{kp-1} + V^{\Sigma Wl}_{kpi}]_{ii}^{-1} \left[ I^i_{kp-1} - \sum_{l=1}^{N} W_{klp} I^{i-1}_{lp} \right]_i \right]$$

wherein a corresponding expression can be set up for k-space. This probability can be used in order to identify image points (voxels, for example) that have artifacts, or to identify cases in which the reconstruction model breaks down. A comparison with the originally acquired MR data sets can furthermore be helpful in establishing whether one or more reconstruction kernels only operate imperfectly. It is likewise possible to identify a region of k-space data in which the MR data are disrupted by artifacts, for example "spike noise". It should be clear that the procedure described here is not only applicable to the iterative solution or the solution with multiple kernels, but can also be used in the additional methods described in the preceding.

In all methods described in the preceding, it is furthermore possible to use masks, for example in order to suppress the imaging of external body parts or the like in MR data. This can in turn take place both in k-space and in image space. Here an example for image space should be provided which, however, is similarly applicable to k-space. For example, it is possible to establish from low resolution MR data (that are acquired to determine the elements of the reconstruction kernel, for example) where the outer surface of the body is positioned. If it is established, values outside of the body in image space can be set to 0 and the variances in image space can likewise be set to low values for these positions. What is known as a "prior in image space" can therefore be generated. For example, the masking can take place in that, given the combination of the reconstructed MR data sets that are described in the preceding and originally acquired MR data sets, an image is inserted into the summation that contains only zeroes and has a large variance for points within the body and a low variance $V^0_{body}$ for the points outside of the body. Due to the very small variance of the points outside of the body, these are very strongly weighted in the combination so that this region is effectively masked. One advantage of such a procedure is that the image set to 0 does not actually need to be added since it contains only zeroes. A term that includes the variances described in the preceding is thus added only in the normalization. The method is thereby applicable in a simple manner both in image space and in k-space. For example, the following solutions result:

$$s^i_k = \left( (v^0_k)^{-1} + (v^0_{body})^{-1} + \sum_{p=1}^{P} K^i_p (v^{\Sigma ws}_{kpi})^{-1} \right)^{-1} \quad (16)$$

$$\left( (v^0_k)^{-1} s^0_k + \sum_{p=1}^{P} K^i_p (v^{\Sigma ws}_{kpi})^{-1} \sum_{l=1}^{N} w_{klp} \otimes s^{j-1}_l \right)$$

$$\Rightarrow I^i_k = \left( (V^0_k)^{-1} + (V^0_{body})^{-1} + \sum_{p=1}^{P} K^i_p (V^{\Sigma Wl}_{kpi})^{-1} \right)^{-1}$$

$$\left( (V^0_k)^{-1} I^0_k + \sum_{p=1}^{P} K^i_p (V^{\Sigma Wl}_{kpi})^{-1} \sum_{l=1}^{N} W_{klp} I^{i-1}_l \right)$$

wherein the originally acquired reduced MR data sets are used again. The Equations $$s^i_k = \left( (v^{i-1}_k)^{-1} + (v^0_{body})^{-1} + \sum_{p=1}^{P} K^i_p (v^{\Sigma ws}_{kpi})^{-1} \right)^{-1} \quad (17)$$

$$\left( (v^{i-1}_k)^{-1} s^{i-1}_k + \sum_{p=1}^{P} K^i_p (v^{\Sigma ws}_{kpi})^{-1} \sum_{l=1}^{N} w_{klp} \otimes s^{j-1}_l \right)$$

$$\Rightarrow I^i_k = \left( (V^{i-1}_k)^{-1} + (V^0_{body})^{-1} + \sum_{p=1}^{P} K^i_p (V^{\Sigma Wl}_{kpi})^{-1} \right)^{-1}$$

$$\left((V_k^{i-1})^{-1}I_k^{i-1} + \sum_{p=1}^{P} K_p^i (V_{kpi}^{\Sigma WI})^{-1} \sum_{l=1}^{N} W_{klp} I_l^{i-1}\right)$$

result for the formulation in which the result of the preceding iteration step is used.

These formulations are indicated here for the use of different reconstruction kernels for each acquisition coil as well as for an iterative application of the reconstruction method given simultaneous weighting with additional weighting factors. However, it should be clear that the masking can likewise take place in the simpler methods described in the preceding, thus for example given a simple combination of a reconstructed MR data set with an originally acquired reduced MR data set. The example shown here merely illustrates that the masking is possible in a simple manner even given a more complicated design of the method.

The variances that a reconstructed data point has depend on, among other things, the reconstruction kernel and the scanning sequence that are used, such that there is the possibility to minimize variances by suitable selection of both. A measure of the quality of the reconstruction is the noise in the supplemented MR data set in comparison to the noise of a completely acquired MR data set. This relationship can be specified as what is known as a g-factor given consideration of the reduction factor R (also called the acceleration factor), which indicates the factor by which the number of acquired k-space data points is reduced. This factor strongly depends on the coil geometry and is called the geometry factor due to this. With the noise $SNR_k^{full}$ for a complete MR data set and $SNR_k^{acc}$ for the supplemented MR data set, the g-factor for the acquisition coil k can be determined as $$g_k = \frac{SNR_k^{full}}{SNR_k^{acc} \cdot \sqrt{R}} \quad (18)$$

$$= \frac{\sigma(n_k^{acc})}{\sigma(n_k^{full}) \cdot \sqrt{R}}$$

$$= \frac{\sqrt{|W \cdot \Sigma^2 \cdot W^H|_{kk}}}{\sqrt{|\Sigma^2|_{kk}}}$$

wherein this is the expression for image space. σ designates the standard deviation of the noise n. Furthermore, W designates the matrix of the weighting of the reconstruction kernel and σ² designates the covariance matrix of the noise of the image data (with correlations between different coils).

In the following it should be assumed that the MR data sets were pre-processed in order to ensure that the covariances of the coil noise were removed and that the data are scaled such that they correspond to virtual coils that have a unit matrix as a noise covariance matrix. Such a decorrelation can take place, for example, by means of a principal component analysis, whereby individual "virtual" acquisition coils that are linearly independent of one another are identified in the acquired MR data sets. The implementation of such a transformation simplifies the considerations without thereby limiting their general validity. The signal-to-noise ratio (SNR) of the complete acquired image data set is provided by:

$$SNR_k^{full} = \frac{I_k}{\sqrt{1}} \quad (19a)$$

The weighted reconstruction described in the preceding maintains the same signal level. The g-factor for the supplemented MR data set can accordingly be determined from the principal diagonals of the covariance matrix for the supplemented MR data set according to:

$$g_k = \sqrt{\frac{\text{Det}[V_k^{acc}]}{R}} \quad (19b)$$

The covariance matrix $V_k^{acc}$ is explicitly indicated in advance for different embodiments of the method according to the invention. $V_k^{acc}$ can likewise be determined for additional embodiments from the specifications made above.

It is thus clear that the g-factor for a specific acquisition coil k (or, respectively, for a specific virtual acquisition coil k) can be optimized in that the variances are minimized. For a variance-weighted reconstruction using an individual GRAPPA kernel, the variances of the ultimately reconstructed supplemented MR image data set can be provided by the elements of the GRAPPA reconstruction kernel, their variances, the variances of the acquired reduced MR image data sets and the image intensities, according to:

$$[V_k^{acc}]_{ii} = \left([V_k^{red}]_{ii}^{-1} + \left(\sum_{l=1}^{N} [V_{lk}^{N}]_{ii}[V_l^{red}]_{ii} + [V_{lk}^{W}]_{ii}[I_l^{red}]_i[I_l^{red}]_i^* + [W_{kl}]_i[W_{kl}]_i^*[V_l^{red}]_{ii}\right)^{-1}\right)^{-1} \quad (20)$$

The indices ii here designate the indices of the respective matrix or, respectively, the respective vector. For example, in the auto-calibrated GRAPPA acquisition method the elements of the GRAPPA kernel and their variances can be determined by a scan of central k-space. The image intensities can likewise be estimated from such a scan since this is a version of the complete scan at low resolution. For example, an estimation can be achieved in that the image in image space is filled outward with zeroes. The image data in image space can be set to zero when the image at low resolution shows that the respective regions are extra-corporeal. In spite of this, the variances will still contain the information with regard to the uncertainties of this estimation. Ultimately, the variances of the image data are determined by the noise level (normalized to 1), the a priori variances that are used for the unsampled k-space data points and, moreover, the scan trajectory in k-space (i.e. the k-space positions at which data were actually acquired). For a predetermined reconstruction kernel it is therefore possible to estimate the variances of the image for different k-space trajectories.

Under the assumption that the noise is normalized and that the same a priori variances are used for each acquisition coil, the expression can be simplified as:

$$\left(\frac{[V^{red}]_{ii}}{[V_k^{acc}]_{ii}} - 1\right)^{-1} = [V^{red}]_{ii}^{-1} \sum_{l=1}^{N} [V_{lk}^{W}]_{ii} [I_l^{red}]_i [I_l^{red}]_i^* + \sum_{l=1}^{N} ([V_{lk}^{W}]_{ii} + [W_{kl}]_i [W_{kl}]_i^*) \quad (21)$$

In areas in which the undersampling causes an aliasing that should be improved, the left side (LHS) of the expression should be small since there are large variances in these regions but it would be desirable to have small variances in the ultimately reconstructed image. The first term of the right side (RHS) of the expression is formed from the inverses of the variances of the reduced MR image data sets (wherein the term is small given high uncertainty), multiplied with the variances of the reconstruction kernel and the image intensities at the corresponding location. The term is therefore small when the reconstruction kernel is precisely known and/or the image data have an intensity of zero. The last term is small when the variances of the elements of the reconstruction kernel are small and the elements themselves are likewise small. It can be concluded from this that, at locations at which the reconstruction kernel elements or their variances are large and at which—to a certain extent—the image intensities of the reduced MR data sets are large, it is disadvantageous if the reduced image data sets have large variances. This can be avoided via corresponding selection of the scan trajectory in that, for example, such areas are completely scanned.

In the case of a GRAPPA reconstruction method, this expression can be simplified when the variances in the elements of the reconstruction kernel are disregarded and, and in fact according to:

$$\left(\frac{[V^{red}]_{ii}}{[V_k^{acc}]_{ii}} - 1\right)^{-1} = \sum_{l=1}^{N} [W_{kl}]_i [W_{kl}]_i^* \text{ bye} \quad (22)$$

This means that, at locations at which the reconstruction kernel has smaller weightings (i.e. at which its elements are small), a larger variance of the reduced MR data sets in comparison to the desired variance of the reconstruction result can be borne without the precision of the reconstruction suffering. The scan trajectory for acquisition of the reduced MR data sets can accordingly be selected such that a larger reduction or undersampling occurs in such regions than in other regions.

A reconstruction kernel for a specific scan trajectory can be selected corresponding to these considerations. A reconstruction kernel is thereby advantageously selected that has smaller weightings in regions in which the scan trajectory leads to higher uncertainty, i.e. to greater variances in the acquired MR data sets.

Furthermore, it can be established that it is not necessary for the variance $V_k^{acc}$ of the reconstruction result—i.e. of the supplemented MR data set—to be small everywhere in these image data. In particular, the method can be optimized for a specific region (for example for a "region of interest", ROI), for example for a specific organ or an examined person. Regions outside of this area can have both a large variance in the acquired reduced MR data sets and large weightings of the reconstruction kernel.

With the use of the aforementioned expressions it is thus possible to select the scanning sequence—i.e. scan trajectory of k-space—and the reconstruction kernel such that the variances are minimized across the entire supplemented MR data set or across a region of this. Significantly improved reconstruction results can thus be achieved relative to conventional methods.

In summary, multiple advantages in the supplementation of acquired reduced MR data sets can be realized with embodiments of the present method. Among these are that the variances of the reduced MR data sets and of the reconstructed MR data sets are considered in the reuse, such that the variances of the result are minimized. Moreover, reduced MR data sets acquired with nearly arbitrary scan trajectories can be supplemented via the application of multiple reconstruction kernels, wherein the respective reconstruction kernel delivering the best reconstruction result for the respective data point thereby receives the strongest weighting. An optimized reconstruction result (i.e. the smallest variances) can therefore be achieved automatically. Furthermore, via the iterative application of the method it is possible to close even larger gaps or, respectively, omissions in the acquired reduced MR data sets, wherein here the variances of the resulting supplemented MR data set are in turn minimized via the weightings with the respective variances that are described above; an optimally precise reconstruction is thus achieved. The method enables both the additional weighting with predetermined weighting factors in order to optimize the result and the use of masks or, respectively, priors in order to suppress regions in the image data, for example. As described above, all of the embodiments presented here can be combined with one another. Naturally, additional modifications are conceivable that fall within the scope of the present invention.

The determination of the elements of the reconstruction kernel (in particular for a GRAPPA reconstruction kernel) and their variances is described in detail in the following. As mentioned above, for the determination of the elements of a GRAPPA kernel a completely scanned region of k-space is used that is predicted by a reconstruction kernel by means of aliasing with said reconstruction kernel. This problem is not trivial since the GRAPPA reconstruction kernel has a weighting of 0 for the point that it should predict. The reconstructed data set for the completely scanned region can be indicated as:

$$s_k = \sum_{l=1}^{N} w_{kl} \otimes s_l \Rightarrow I_k = \sum_{l=1}^{N} W_{kl} \, I_l \quad (23)$$

(for k-space and image space). The transformation between the k-space reconstruction kernel and the image space weightings of the kernel is achieved via a conventional Fourier transformation. For this the weightings in the reconstruction kernel $w_{kl}$ are filled with zeroes by means of the matrix U and are subsequently Fourier-transformed in order to determine a vector that forms the diagonals of the matrix $W_{kl}$ (weightings of the reconstruction kernel in image space). This can be expressed as:

$$\text{DiagVect}[W_{kl}] = \text{FFT U DiagVect}[w_{kl}] \quad (24)$$

For simplification of the determination of the variances that is described in the following, a diagonal vector of k-space weightings of the reconstruction kernel can be defined in order to determine for each acquisition coil a reconstructed MR data set from the reduced MR data sets that were acquired with all coils l (wherein the index l is the index of the acquisition coils over which the summation takes place). This vector accordingly includes all entries of the reconstruction kernel $w_{kl}$ (of where there are $N^2$) and can be written as:

$$\vec{B} = \text{DiagVect}[w] \tag{25}$$

By concatenating the MR data vectors of each coil as well as the matrix U for filling with zeroes and the FFT matrix, the problem that should be solved can be written as:

$$\vec{s} = \text{diag}(\vec{s})\text{FFT}^{-1}U\vec{B} \tag{26}$$

The elements of the reconstruction kernel ($\vec{B}$) can be determined with this equation from the acquired MR data ($\vec{s}$).

If this were a perfect model, the difference between the model and the result values would primarily be determined by the noise ($\vec{n}$) of the result values ($\vec{s}$). However, this is only an approximation since the diagonal matrix diag ($\vec{s}$) will likewise contain noise. As mentioned above, it is advantageous to pre-process the data so that the noise in ($\vec{s}$) is uncorrelated and has a covariance matrix that corresponds to the unit matrix (1). Under these conditions the reconstruction kernel is determined based on multiple independently noisy data points in diag ($\vec{s}$), whereby the effect of the noise on this source is reduced. Under the assumption that the differences between the model and the MR data are primarily determined by the noise in the result values ($\vec{s}$), it results that:

$$\vec{s} = \text{diag}(\vec{s})\text{FFT}^{-1}U\vec{B} + \vec{n} \tag{27}$$

The matrix terms can thereby be combined in a matrix G, such that it results that $$G = \text{diag}(\vec{s})\text{FFT}^{-1}U$$

$$\vec{s} = G\vec{B} + \vec{n} \tag{28}$$

In order to simplify the later calculations, the problem can be rewritten so that the matrix G is replaced by an orthogonal matrix H that satisfies the following orthogonality condition:

$$H^\dagger C^{-1} H = I \tag{29}$$

To transform the problem, a transformation matrix T can be defined using the orthogonality condition:

$$\vec{A} = T\vec{B}$$

$$G = HT$$

$$T^{-1\dagger} G^\dagger C^{-1} G T^{-1} = I \tag{30}$$

$$G^\dagger C^{-1} G = T^\dagger T$$

$$(G^\dagger C^{-1} G)^{\frac{1}{2}} = T$$

$$H = G(G^\dagger C^{-1} G)^{-\frac{1}{2}}$$

wherein 1 represents the unit matrix (in this case an m×m matrix). The pre-processing of the originally acquired data can finally take place so that C is an mn×mn unit matrix. Assuming that the model is applicable, the probability of the data can be determined as:

$$P(\vec{d} \mid \vec{s}, C_n) = (2\pi)^{-NM} \text{Det}[C]^{-1} \text{Exp}\left[-\frac{1}{2}(\vec{d} - \vec{s})^\dagger c_n^{-1} (\vec{d} - \vec{s})\right] \tag{31}$$

If the data are scaled in the pre-processing such that the matrix C is the unit matrix, the expression for the probability can then be simplified as:

$$P(\vec{d} \mid \vec{s}, C_n) = (2\pi)^{-NM} \text{Exp}\left[-\frac{1}{2}(\vec{d}^\dagger - \vec{A}^\dagger H^\dagger)(\vec{d} - H\vec{A})\right] \tag{32}$$

$$P(\vec{d} \mid \vec{s}, C_n) = (2\pi)^{-NM} \text{Exp}\left[-\frac{1}{2}(\vec{d}^\dagger \vec{d} - \vec{A}^\dagger H^\dagger \vec{d} - \vec{d}^\dagger H \vec{A} + \vec{A}^\dagger \vec{A})\right]$$

$$P(\vec{d} \mid \vec{s}, C_n) = (2\pi)^{-NM} \text{Exp}\left[-\frac{1}{2}\vec{d}^\dagger \vec{d}\right] \text{Exp}\left[-\frac{1}{2}(\vec{A}^\dagger \vec{A} - \vec{A}^\dagger H^\dagger \vec{d} - \vec{d}^\dagger H \vec{A})\right]$$

wherein ($\vec{d}$) designates the actually measured, noise-plagued, reduced MR data sets. The conditional probability that these data sets are measured is thus determined under the assumption of a defined covariance matrix $C_n$ and under the assumption of the underlying "noise-free" MR data $\vec{s}$. $\vec{A}$ includes the transformed entries of the reconstruction kernel and matrix H corresponds to the transformed matrix G (see Equation 28).

The goal is now the determination of the elements of the reconstruction kernel, i.e. of that of $\vec{A}$ as well as its variances. For this a marginalization (i.e. integration) is implemented over all possible complex reconstruction kernel elements. Marginalization is a known mathematical method that should not be explained in detail here. A complex prior of the following form is initially added for the elements of the reconstruction kernel:

$$P(\vec{A} \mid \vec{A_0}, C_A) = (2\pi)^{-M} \text{Det}[C_A]^{-1} \text{Exp}\left[-\frac{1}{2}(\vec{A} - \vec{A_0})^\dagger C_A^{-1} (\vec{A} - \vec{A_0})\right] \tag{33}$$

$$P(\vec{A} \mid \vec{A_0}, C_A) = (2\pi)^{-M} \text{Det}[C_A]^{-1} \text{Exp}\left[-\frac{1}{2}\vec{A_0}^\dagger C_A^{-1} \vec{A_0}^\dagger\right]$$

$$\text{Exp}\left[-\frac{1}{2}(\vec{A}^\dagger C_A^{-1} \vec{A} - \vec{A_0}^\dagger C_A^{-1} \vec{A} - \vec{A}^\dagger C_A^{-1} \vec{A_0})\right]$$

A total probability can essentially be derived from a conditional probability by means of a marginalization. A prior essentially represents a probability distribution for the uncertainty in the measured value. $C_A$ designates the transformed covariance matrix for the elements of the reconstruction kernel and $\vec{A_0}$ designates the vector of the transformed, "noise-liberated" elements of the reconstruction kernel. A combination of the model 32 with this prior yields:

$$P(\vec{d} \mid \vec{s}, C_n, \vec{A_0}, C_A) = \tag{34}$$

$$(2\pi)^{-(N+1)M} \text{Det}[C_A]^{-1} \text{Exp}\left[-\frac{1}{2}(\vec{d}^\dagger \vec{d} + \vec{A_0}^\dagger C_A^{-1} \vec{A_0}^\dagger)\right]$$

$$\text{Exp}\left[-\frac{1}{2}(\vec{A}^\dagger (I + C_A^{-1})\vec{A} - \vec{A}^\dagger (H^\dagger \vec{d} + C_A^{-1} \vec{A_0}) - (\vec{d}^\dagger H + \vec{A_0}^\dagger C_A^{-1})\vec{A})\right]$$

wherein the parameters $\vec{A_0}$ and $C_a$ of the prior are linked with those of the entries of the reconstruction kernel via the transformation T as follows:

$$\vec{A_0} = T \vec{B_0}$$

$$C_A = T C_B T^\dagger \tag{35}$$

By determining the square of the last exponent, Equation 34 can be simplified in order to obtain a Gaussian form:

$$P(\vec{d} \mid \vec{s}, C_n, \vec{A_0}, C_A) = \quad (36)$$

$$(2\pi)^{-(N+1)M} \text{Det}[C_A]^{-1} \text{Exp}\left[-\frac{1}{2}\left(\vec{d}^\dagger \vec{d} + \vec{A_0}^\dagger C_A^{-1} \vec{A_0}^\dagger\right)\right]$$

$$\text{Exp}\left[-\frac{1}{2}\left(\vec{A}^\dagger (I + C_A^{-1})\vec{A} - \vec{A}^\dagger \left(H^\dagger \vec{d} + C_A^{-1}\vec{A_0}\right) - \left(\vec{d}^\dagger H + \vec{A_0}^\dagger C_A^{-1}\right)\vec{A}\right)\right]$$

wherein a calculation of the square yields:

$$\vec{\mu_A} = (I + C_A^{-1})^{-1}\left(H^\dagger \vec{d} + C_A^{-1}\vec{A_0}\right) \quad (37)$$

$$D_A = (I + C_A^{-1})^{-1}$$

$$P(\vec{d} \mid \vec{A}, H, C_n, \vec{A_0}, C_A) =$$

$$(2\pi)^{-NM} \text{Det}[C_A]^{-1} \text{Exp}\left[-\frac{1}{2}\left(\vec{d}^\dagger \vec{d} + \vec{A_0}^\dagger C_A^{-1}\vec{A_0}^\dagger\right)\right](2\pi)^{-N}\text{Det}[D_A]^{-1}$$

$$\text{Exp}\left[-\frac{1}{2}(\vec{A} - \vec{\mu_A})^\dagger D_A^{-1}(\vec{A} - \vec{\mu_A})\right]\text{Det}[D_A]\text{Exp}\left[\frac{1}{2}\vec{\mu_A}^\dagger D_A^{-1}\vec{\mu_A}\right]$$

For marginalization, integration now takes place via this expression over all possible values of the complex $\vec{A}$, whereby the probability without dependency on $\vec{A}$ is defined as:

$$P(\vec{d} \mid H, C_n, \vec{A_0}, C_A) = (2\pi)^{-NM}\text{Det}[C_A]^{-1} \quad (38)$$

$$\text{Det}[D_A]\text{Exp}\left[-\frac{1}{2}\left(\vec{d}^\dagger \vec{d} + \vec{A_0}^\dagger C_A^{-1}\vec{A_0}^\dagger - \vec{\mu_A}^\dagger D_A^{-1}\vec{\mu_A}\right)\right]$$

$$\int (2\pi)^{-N} D_A^{-1} \text{Exp}\left[-\frac{1}{2}(\vec{A} - \vec{\mu_A})^\dagger D_A^{-1}(\vec{A} - \vec{\mu_A})\right] d\vec{A}$$

However, this integral is an integral over a Gaussian distribution and accordingly is 1:

$$P(\vec{d} \mid H, C_n, \vec{A_0}, C_A) = (2\pi)^{-NM}\text{Det}[C_A]^{-1} \quad (39)$$

$$\text{Det}[D_A]\text{Exp}\left[-\frac{1}{2}\left(\vec{d}^\dagger \vec{d} + \vec{A_0}^\dagger C_A^{-1}\vec{A_0}^\dagger - \vec{\mu_A}^\dagger D_A^{-1}\vec{\mu_A}\right)\right]$$

Since there are no further unknowns, this probability of 1 should result. The expected values for the elements of the GRAPPA reconstruction kernel and the covariance matrix that is associated with this can accordingly be determined according to:

$$\vec{\mu_B} = T^{-1}\vec{\mu_A}$$

$$\vec{\mu_B} = T^{-1}(I + (TC_BT^\dagger)^{-1})^{-1}(H^\dagger \vec{d} + (TC_BT^\dagger)^{-1}T\mathbb{T}\vec{B_0})$$

$$D_B = T^{-1}D_A(T^{-1})^\dagger$$

$$D_B = T^{-1}(I + (TC_BT^\dagger)^{-1})^{-1}(T^{-1})^\dagger \quad (40)$$

The principal diagonal of $D_B$ includes the variances for the estimated elements of the reconstruction kernel. It is thus possible to determine the variances of the reconstruction kernel. The method is accordingly applicable to other reconstruction kernels.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to supplement acquired magnetic resonance (MR) data comprising:
    operating a magnetic resonance data acquisition unit comprising a plurality of acquisition coils to acquire a reduced MR data set with each coil, with said coils operated in parallel to acquire multiple reduced MR data sets with an accelerated acquisition procedure that undersamples k-space;
    in a processor, for a specific one of said acquisition coils, applying a reconstruction kernel for said specific one of said acquisition coils to said multiple reduced data sets to calculate, from the multiple reduced MR data sets, a reconstructed MR data set comprising supplemented MR data for said specific one of said acquisition coils, by using said reconstruction kernel to reconstruct, from the multiple reduced MR data sets, at least some MR data that are absent from the reduced MR data set acquired by said specific one of said acquisition coils;
    in said processor, determining statistical variances of the reduced MR data set acquired with said specific one of said acquisition coils, as MR data variances;
    in said processor, determining statistical variances of the MR data set reconstructed for said specific one of the acquisition coils, as reconstruction data variances; and
    in said processor, reusing the reduced MR data set acquired with said specific one of the acquisition coils in the reconstructed MR data set to determine a supplemental MR data set for said specific one of said acquisition coils, by combining the reduced MR data set weighted with the MR data variances and the reconstructed MR data set weighted with the reconstruction data variances, and making said supplemental MR data set available in electronic form as a data file.

2. A method as claimed in claim 1 comprising determining said statistical variances of said reconstructed MR data set by determining variances of elements of said reconstruction kernel.

3. A method as claimed in claim 2 comprising determining the statistical variances of the reconstructed MR data set from variances of elements of the reconstruction kernel and variances of the multiple reduced MR data sets.

4. A method as claimed in claim 1 comprising determining the MR data variances for the reduced MR data set acquired by said specific one of said acquisition coils as variances in k-space for k-space points that were not scanned and were set to a predetermined value.

5. A method as claimed in claim 1 comprising determining the MR data variances by determining a covariance matrix for the reduced MR data set, and weighting the MR data variances by multiplying the reduced MR data set with the inverse of the covariance matrix.

6. A method as claimed in claim 5 comprising determining said covariance matrix as a matrix selected from the group consisting of a diagonal covariance matrix that includes only corresponding variances, and a variance vector that includes only the corresponding variances.

7. A method as claimed in claim 1 comprising determining the reconstruction data variances by determining a co-variance matrix for the reconstructed MR data set and multiplying the reconstructed MR data set with the inverse of the co-variance matrix.

8. A method as claimed in claim 7 comprising determining said covariance matrix as a matrix selected from the group consisting of a diagonal covariance matrix that includes only corresponding variances, and a variance vector that includes only the corresponding variances.

9. A method as claimed in claim 1 wherein said MR data sets exist in k-space, and comprising calculating the reconstructed MR data set by aliasing the reconstruction kernel with multiple reduced k-space data sets, or by multiplication of the reconstruction kernel with the multiple reduced MR data sets.

10. A method as claimed in claim 1 comprising determining the variances of the reconstructed MR data set by determining variances of elements of the reconstruction kernel by:
   determining a conditional probability for a location of a noise-plagued MR data set acquired by the specific one of the acquisition coils, using a specific MR signal and a specific covariance matrix for said specific one of said acquisition coils, said conditional probability depending at least on error-plagued reconstruction kernel elements;
   adding a complex prior to the conditional probability, the complex prior representing a distribution of the elements of the reconstruction kernel dependent on the covariances of the reconstruction kernel elements and the underlying reconstruction kernel elements; and
   marginalizing the conditional probability across the error-plagued reconstruction kernel elements to determine the covariances of the reconstruction kernel elements.

11. A method as claimed in claim 1 comprising repeatedly, iteratively determining said supplemented MR data set in a plurality of iteration steps with the supplemented MR data set calculated in each iteration step being used to determine the reconstructed MR data set in an immediately following iteration step.

12. A method as claimed in claim 11 comprising, in each iteration step, reusing the reduced MR data set originally acquired for said specific one of said acquisition coils.

13. A method as claimed in claim 11 comprising, in each iteration step, reusing the supplemented MR data set determined in an immediately preceding iteration step.

14. A method as claimed in claim 1 comprising combining the reduced MR data set and the reconstructed MR data set using a mask that comprises a mask MR data set and mask variances, and weighting said mask MR data set with the mask variances, said mask defining regions that are represented by the supplemental MR data set.

15. A method as claimed in claim 14 comprising generating said mask MR data set in image space corresponding to an MR image having image point values set to zero, and wherein said mask variances in image space are set to high predetermined values in a region to be imaged and are set to lower predetermined values outside of said region.

16. A method as claimed in claim 1 comprising determining a combined reconstructed MR data set for said specific one of said acquisition coils using multiple, different reconstruction kernels, and reusing the acquired reduced MR data set in the combined reconstructed MR data set to determine said supplemental MR data set.

17. A method as claimed in claim 16 comprising weighting said combined reconstructed MR data set with a predetermined weighting factor.

18. A method as claimed in claim 17 comprising selecting said predetermined weighting factor to cause, in determining said supplemental MR data set, a contribution of the combined reconstructed MR data set is less than a contribution of the reduced MR data set acquired for said specific one of said acquisition coils.

19. A method as claimed in claim 1 comprising weighting said reconstructed MR data set with a predetermined weighting factor.

20. A method as claimed in claim 19 comprising selecting said predetermined weighting factor to cause, in determining said supplemental MR data set, a contribution of the reconstructed MR data set is less than a contribution of the reduced MR data set acquired for said specific one of said acquisition coils.

21. A method as claimed in claim 1 comprising selecting said reconstruction kernel from the group consisting of a GRAPP kernel and a SENSE kernel.

22. A method as claimed in claim 1 comprising determining a reduced MR data set for each of said acquisition coils by, for each acquisition coil, determining a reconstructed MR data set using a reconstruction kernel respectively for that acquisition coil, to the multiple reduced MR data sets.

23. A method as claimed in claim 1 comprising determining elements of said reconstruction kernel from data located in a central region of k-space of said multiple reduced data sets that were completely scanned.

24. A method to supplement acquired magnetic resonance (MR) data comprising:
   operating a magnetic resonance data acquisition unit comprising a plurality of acquisition coils to acquire a reduced MR data set with each coil, with said coils operated in parallel to acquire multiple reduced MR data sets with an accelerated acquisition procedure that undersamples k-space;
   in a processor, for a specific one of said acquisition coils, applying a first reconstruction kernel for said specific one of said acquisition coils to said multiple reduced data sets to calculate, from the multiple reduced MR data sets, a first reconstructed MR data set comprising first supplemented MR data for said specific one of said acquisition coils, by using said second reconstruction kernel to reconstruct, from the multiple reduced MR data sets, at least some MR data that are absent from the reduced MR data set acquired by said specific one of said acquisition coils;
   in said processor, for said specific one of said acquisition coils, applying a second reconstruction kernel, different from said first reconstruction kernel, for said specific one of said acquisition coils to said multiple reduced data sets to calculate, from the multiple reduced MR data sets, a second reconstructed MR data set comprising second supplemented MR data for said specific one of said acquisition coils, by using said reconstruction kernel to reconstruct, from the multiple reduced MR data sets, at least some MR data that are absent from the reduced MR data set acquired by said specific one of said acquisition coils;
   determining variances of said first reconstructed MR data set as first reconstruction data variances and determining variances of said second reconstructed MR data set as second reconstruction data variances; and
   combining said first reconstructed MR data set and said second MR reconstructed data set to form a combined reconstructed MR data set, with weighting of said first reconstructed MR data set with the first reconstruction data variances and weighting of said second reconstructed MR data set with said second reconstruction data variances.

25. A method as claimed in claim 24 comprising reusing the reduced MR data set acquired with said specific one of said acquisition coils in the combined reconstruction data set to determine a supplemental MR data set.

26. A method as claimed in claim 24 comprising combining the first and second reconstructed MR data sets in an iterative procedure comprising a plurality of iteration steps, with each reconstructed MR data set determine with one of said reconstruction kernels being combined in each iteration step with the supplemental MR data set determined in an immediately preceding iteration step, with the acquired reduced MR data set or the result of a preceding iteration step being reused in each subsequent iteration step.

27. A method as claimed in claim 24 comprising comparing the MR data set reconstructed with one of the reconstruction kernels with the acquired reduced MR data set, or the MR data set reconstructed with another of the reconstruction kernels, or the combined reconstructed MR data set, to determine whether the reconstruction kernel has a sufficient reconstruction precision or to identify artifacts in the acquired MR data set.

28. A method as claimed in claim 24 comprising weighting said reconstructed MR data set with a predetermined weighting factor.

29. A method as claimed in claim 28 comprising determining said weighting factor for each of said MR data sets reconstructed respectively with said first and second reconstruction kernels to cause reconstructed MR data sets determined with extrapolated kernels to be weighted less than reconstructed MR data sets determined with interpolated kernels.

30. A method as claimed in claim 24 comprising selecting said predetermined weighting factor to cause, in determining said supplemental MR data set, a contribution of the combined reconstructed MR data set is less than a contribution of the reduced MR data set acquired for said specific one of said acquisition coils.

31. A method as claimed in claim 24 comprising selecting said reconstruction kernel from the group consisting of a GRAPP kernel and a SENSE kernel.

32. A method as claimed in claim 24 comprising determining a reduced MR data set for each of said acquisition coils by, for each acquisition coil, determining a reconstructed MR data set using a reconstruction kernel respectively for that acquisition coil, to the multiple reduced MR data sets.

33. A method as claimed in claim 24 comprising determining elements of said reconstruction kernel from data located in a central region of k-space of said multiple reduced data sets that were completely scanned.

34. A magnetic resonance (MR) system comprising:
a magnetic resonance data acquisition unit comprising a plurality of acquisition coils;
a control unit configured to operate said data acquisition unit to acquire a reduced MR data set with each coil, with said coils operated in parallel to acquire multiple reduced MR data sets with an accelerated acquisition procedure that undersamples k-space;
a processor configured, for a specific one of said acquisition coils, to apply a reconstruction kernel for said specific one of said acquisition coils to said multiple reduced data sets to calculate, from the multiple reduced MR data sets, a reconstructed MR data set comprising supplemented MR data for said specific one of said acquisition coils, by using said reconstruction kernel to reconstruct, from the multiple reduced MR data sets, at least some MR data that are absent from the reduced MR data set acquired by said specific one of said acquisition coils;
said processor being configured to determine statistical variances of the reduced MR data set acquired with said specific one of said acquisition coils, as MR data variances;

said processor being configured to determine statistical variances of the MR data set reconstructed for said specific one of the acquisition coils, as reconstruction data variances; and
said processor being configured to reuse the reduced MR data set acquired with said specific one of the acquisition coils in the reconstructed MR data set to determine a supplemental MR data set for said specific one of said acquisition coils, by combining the reduced MR data set weighted with the MR data variances and the reconstructed MR data set weighted with the reconstruction data variances, and to make said supplemental MR data set available in electronic form as a data file.

35. A magnetic resonance (MR) system comprising:
a magnetic resonance data acquisition unit comprising a plurality of acquisition coils;
a control unit configured to operate said data acquisition unit to acquire a reduced MR data set with each coil, with said coils operated in parallel to acquire multiple reduced MR data sets with an accelerated acquisition procedure that undersamples k-space;
a processor, configured for a specific one of said acquisition coils, to apply a reconstruction kernel for said specific one of said acquisition coils to said multiple reduced data sets to calculate, from the multiple reduced MR data sets, a first reconstructed MR data set comprising first supplemented MR data for said specific one of said acquisition coils, by using said reconstruction kernel to reconstruct, from the multiple reduced MR data sets, at least some MR data that are absent from the reduced MR data set acquired by said specific one of said acquisition coils;
said processor being configured, for said specific one of said acquisition coils, to apply a second reconstruction kernel different from said first reconstruction kernel, for said specific one of said acquisition coils to said multiple reduced data sets to calculate, from the multiple reduced MR data sets, a second reconstructed MR data set comprising second supplemented MR data for said specific one of said acquisition coils, by using said reconstruction kernel to reconstruct, from the multiple reduced MR data sets, at least some MR data that are absent from the reduced MR data set acquired by said specific one of said acquisition coils;
said processor being configured to determine variances of said first reconstructed MR data set as first reconstruction data variances and determining variances of said second reconstructed MR data set as second reconstruction data variances; and
said processor being configured to combine said first reconstructed MR data set and said second MR reconstructed data set to form a combined reconstructed MR data set, with weighting of said first reconstructed MR data set with the first reconstruction data variances and weighting of said second reconstructed MR data set with said second reconstruction data variances.

36. A non-transitory, computer-readable data storage medium encoded with programming instructions, said data storage medium being loaded into a computerized control system of a magnetic resonance (MR) imaging system comprising a plurality of acquisition coils, and said programming instructions causing said computerized control system to:
operate the MR system to acquire a reduced MR data set with each coil, with said coils operated in parallel to acquire multiple reduced MR data sets with an accelerated acquisition procedure that undersamples k-space;

for a specific one of said acquisition coils, apply a reconstruction kernel for said specific one of said acquisition coils to said multiple reduced data sets to calculate, from the multiple reduced MR data sets, a reconstructed MR data set comprising supplemented MR data for said specific one of said acquisition coils, by using said reconstruction kernel to reconstruct, from the multiple reduced MR data sets, at least some MR data that are absent from the reduced MR data set acquired by said specific one of said acquisition coils;

determine statistical variances of the reduced MR data set acquired with said specific one of said acquisition coils, as MR data variances;

determine statistical variances of the MR data set reconstructed for said specific one of the acquisition coils, as reconstruction data variances; and reuse the reduced MR data set acquired with said specific one of the acquisition coils in the reconstructed MR data set to determine a supplemental MR data set for said specific one of said acquisition coils, by combining the reduced MR data set weighted with the MR data variances and the reconstructed MR data set weighted with the reconstruction data variances, and make said supplemental MR data set available in electronic form as a data file.

37. A non-transitory, computer-readable data storage medium encoded with programming instructions, said data storage medium being loaded into a computerized control system of a magnetic resonance (MR) imaging system comprising a plurality of acquisition coils, and said programming instructions causing said computerized control system to:

operate the MR system to acquire a reduced MR data set with each coil, with said coils operated in parallel to acquire multiple reduced MR data sets with an accelerated acquisition procedure that undersamples k-space;

for a specific one of said acquisition coils, apply a first reconstruction kernel for said specific one of said acquisition coils to said multiple reduced data sets to calculate, from the multiple reduced MR data sets, a first reconstructed MR data set comprising first supplemented MR data for said specific one of said acquisition coils, by using said reconstruction kernel to reconstruct, from the multiple reduced MR data sets, at least some MR data that are absent from the reduced MR data set acquired by said specific one of said acquisition coils;

for a specific one of said acquisition coils, apply a second reconstruction kernel, different from said first reconstruction kernel, for said specific one of said acquisition coils to said multiple reduced data sets to calculate, from the multiple reduced MR data sets, a second reconstructed MR data set comprising second supplemented MR data for said specific one of said acquisition coils, by using said reconstruction kernel to reconstruct, from the multiple reduced MR data sets, at least some MR data that are absent from the reduced MR data set acquired by said specific one of said acquisition coils;

determine variances of said first reconstructed MR data set as first reconstruction data variances and determining variances of said second reconstructed MR data set as second reconstruction data variances; and combine said first reconstructed MR data set and said second MR reconstructed data set to form a combined reconstructed MR data set, with weighting of said first reconstructed MR data set with the first reconstruction data variances and weighting of said second reconstructed MR data set with said second reconstruction data variances.

\* \* \* \* \*